(12) United States Patent
Zhang et al.

(10) Patent No.: US 11,094,704 B2
(45) Date of Patent: Aug. 17, 2021

(54) METHOD OF FORMING A THREE-DIMENSIONAL MEMORY DEVICE AND A DRIVER CIRCUIT ON OPPOSITE SIDES OF A SUBSTRATE

(71) Applicant: SANDISK TECHNOLOGIES LLC, Addison, TX (US)

(72) Inventors: Yanli Zhang, San Jose, CA (US); Johann Alsmeier, San Jose, CA (US); Teruo Okina, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 8 days.

(21) Appl. No.: 16/671,025

(22) Filed: Oct. 31, 2019

(65) Prior Publication Data
US 2021/0134819 A1    May 6, 2021

(51) Int. Cl.
| | |
|---|---|
| *H01L 27/11548* | (2017.01) |
| *H01L 27/11556* | (2017.01) |
| *H01L 27/11582* | (2017.01) |
| *H01L 27/11529* | (2017.01) |
| *H01L 27/11573* | (2017.01) |

(Continued)

(52) U.S. Cl.
CPC .. *H01L 27/11548* (2013.01); *H01L 21/76898* (2013.01); *H01L 23/481* (2013.01); *H01L 24/06* (2013.01); *H01L 24/08* (2013.01); *H01L 25/0657* (2013.01); *H01L 27/11529* (2013.01); *H01L 27/11556* (2013.01); *H01L 27/11573* (2013.01); *H01L 27/11575* (2013.01); *H01L 27/11582* (2013.01); *H01L 2224/06181* (2013.01); *H01L 2224/08145* (2013.01); *H01L 2225/06565* (2013.01)

(58) Field of Classification Search
None
See application file for complete search history.

(56) References Cited

U.S. PATENT DOCUMENTS

| | | |
|---|---|---|
| 10,199,326 B1 | 2/2019 | Ohsaki |
| 10,354,980 B1 | 7/2019 | Mushiga et al. |

(Continued)

OTHER PUBLICATIONS

Notification of Transmittal of the International Search Report and Written Opinion of the International Search Authority for International Patent Application No. PCT/US2020/024398, dated Jul. 29, 2020, 12 pages.

(Continued)

*Primary Examiner* — Hsien Ming Lee
(74) *Attorney, Agent, or Firm* — The Marbury Law Group PLLC

(57) ABSTRACT

A method of forming a device structure includes forming a memory-level structure including a three-dimensional memory device over a front side surface of a semiconductor substrate, forming memory-side dielectric material layers over the memory-level structure, bonding a handle substrate to the memory-side dielectric material layers, thinning the semiconductor substrate while the handle substrate is attached to the memory-side dielectric material layers, forming a driver circuit including field effect transistors on a backside semiconductor surface of the semiconductor substrate after thinning the semiconductor substrate, and removing the handle substrate from the memory-side dielectric material layers.

3 Claims, 32 Drawing Sheets

(51) Int. Cl.
*H01L 27/11575* (2017.01)
*H01L 21/768* (2006.01)
*H01L 25/065* (2006.01)
*H01L 23/00* (2006.01)
*H01L 23/48* (2006.01)

(56) References Cited

U.S. PATENT DOCUMENTS

| | | |
|---|---|---|
| 10,354,987 B1 | 7/2019 | Mushiga et al. |
| 10,381,362 B1 | 8/2019 | Cui et al. |
| 2015/0206587 A1 | 7/2015 | Hasegawa et al. |
| 2017/0200700 A1 | 7/2017 | Das et al. |
| 2017/0373078 A1* | 12/2017 | Chu .................. H01L 27/1157 |
| 2020/0098776 A1* | 3/2020 | Sugisaki ............. H01L 27/0688 |

OTHER PUBLICATIONS

Endoh et al., "Novel Ultra High Density Memory with a Stacked-Surrounding Gate Transistor (S-SGT) Structured Cell," IEDM Proc., (2001), 33-36.
U.S. Appl. No. 16/249,423, filed Jan. 16, 2019, SanDisk Technologies LLC.

* cited by examiner

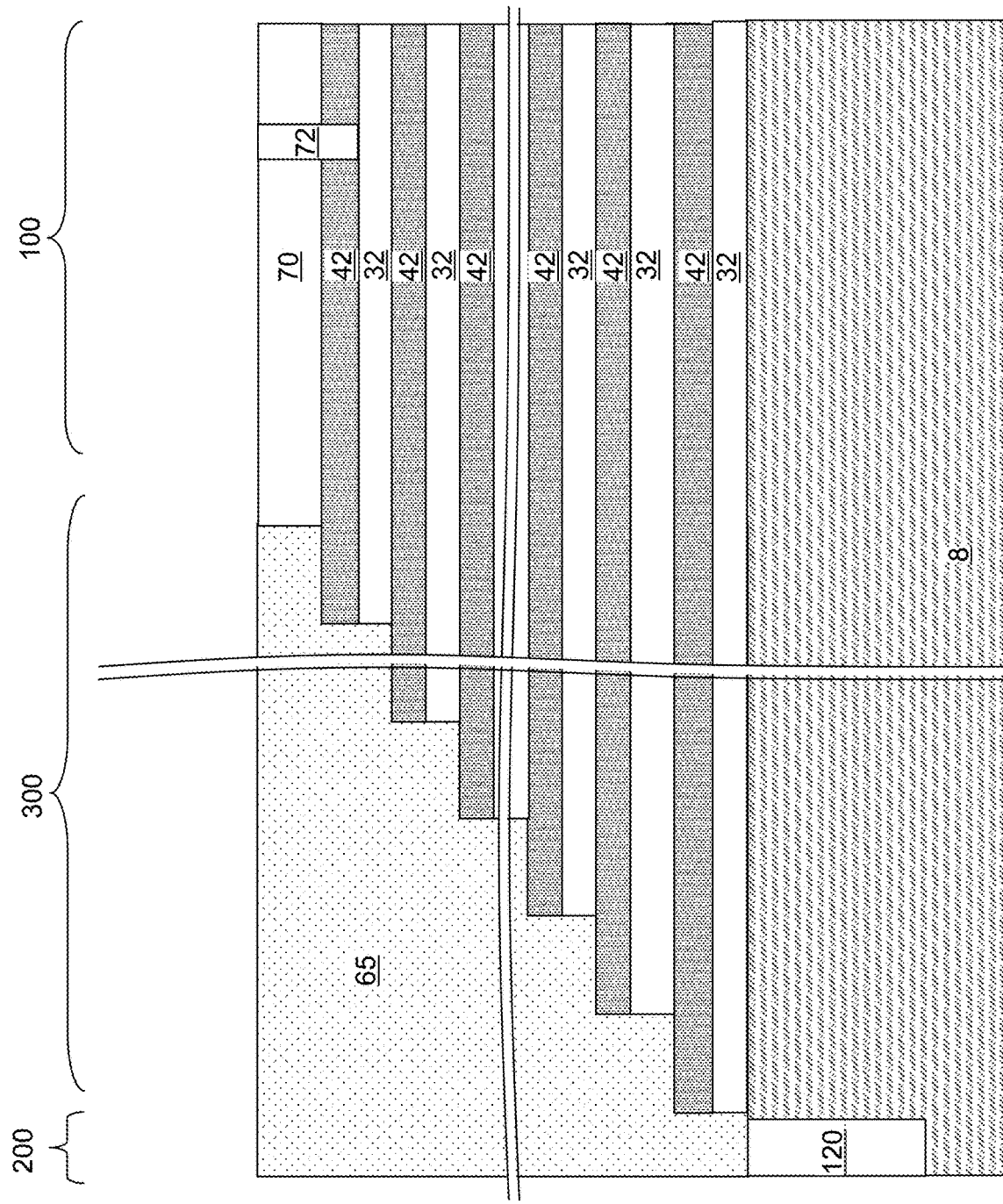

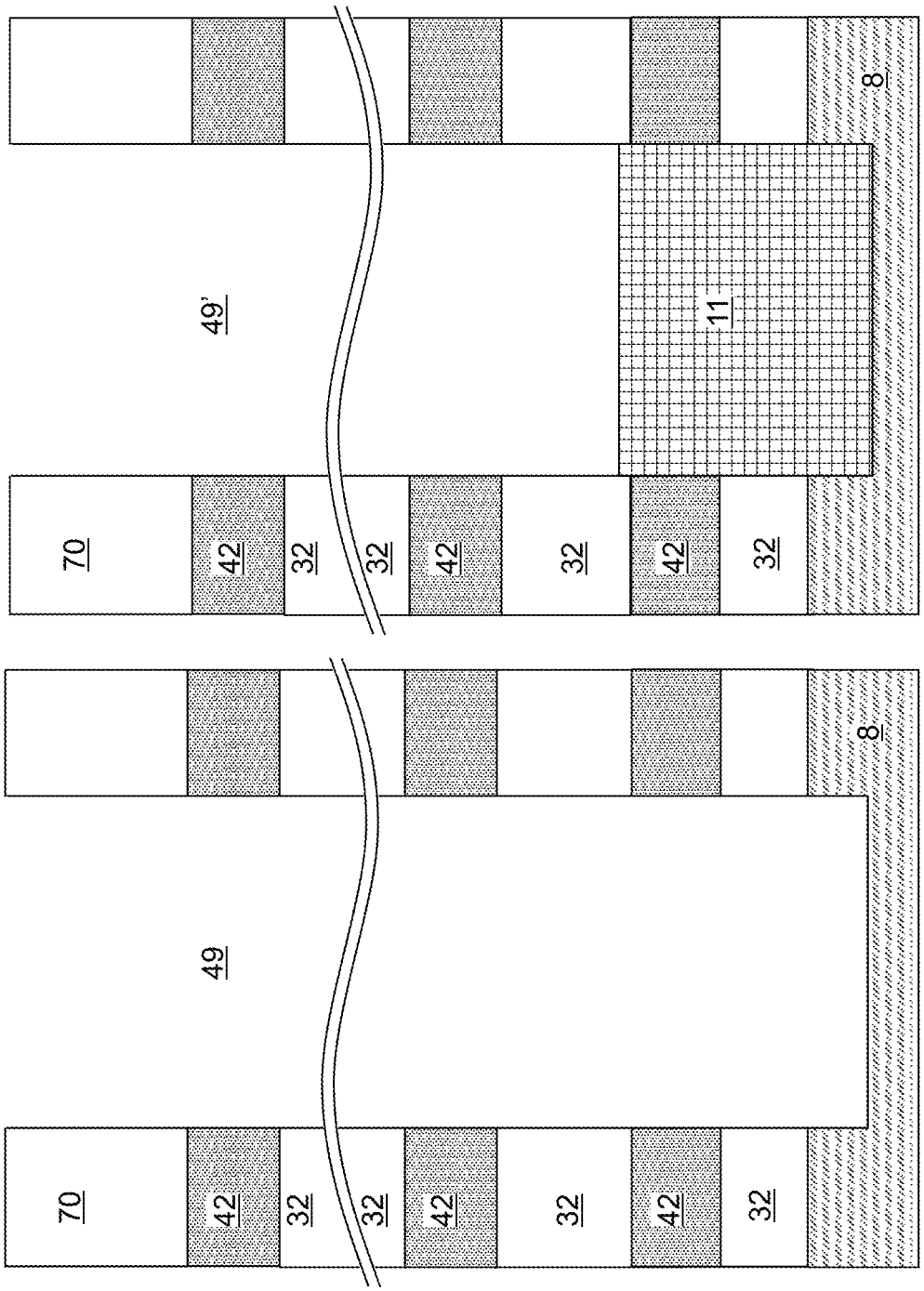

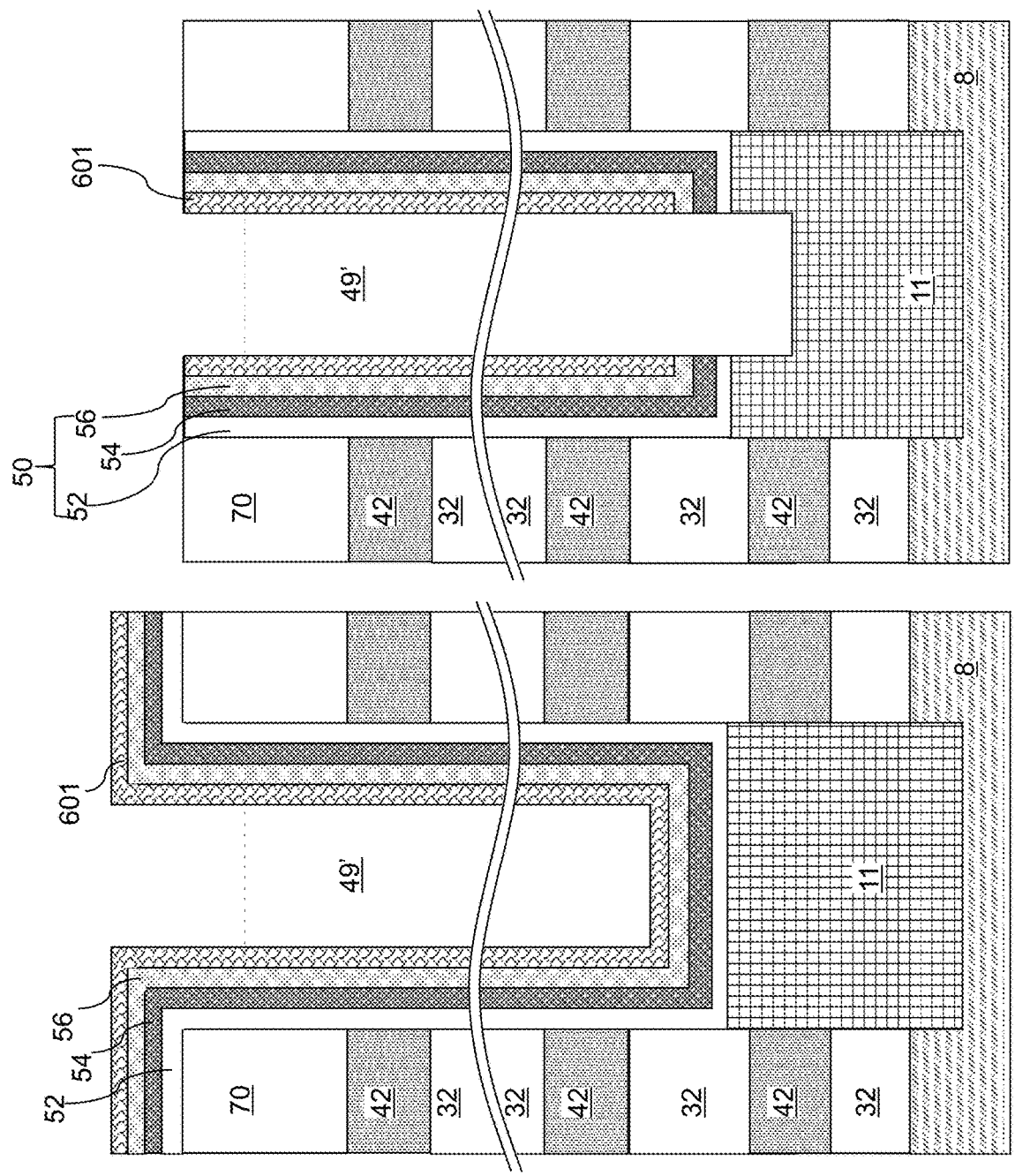

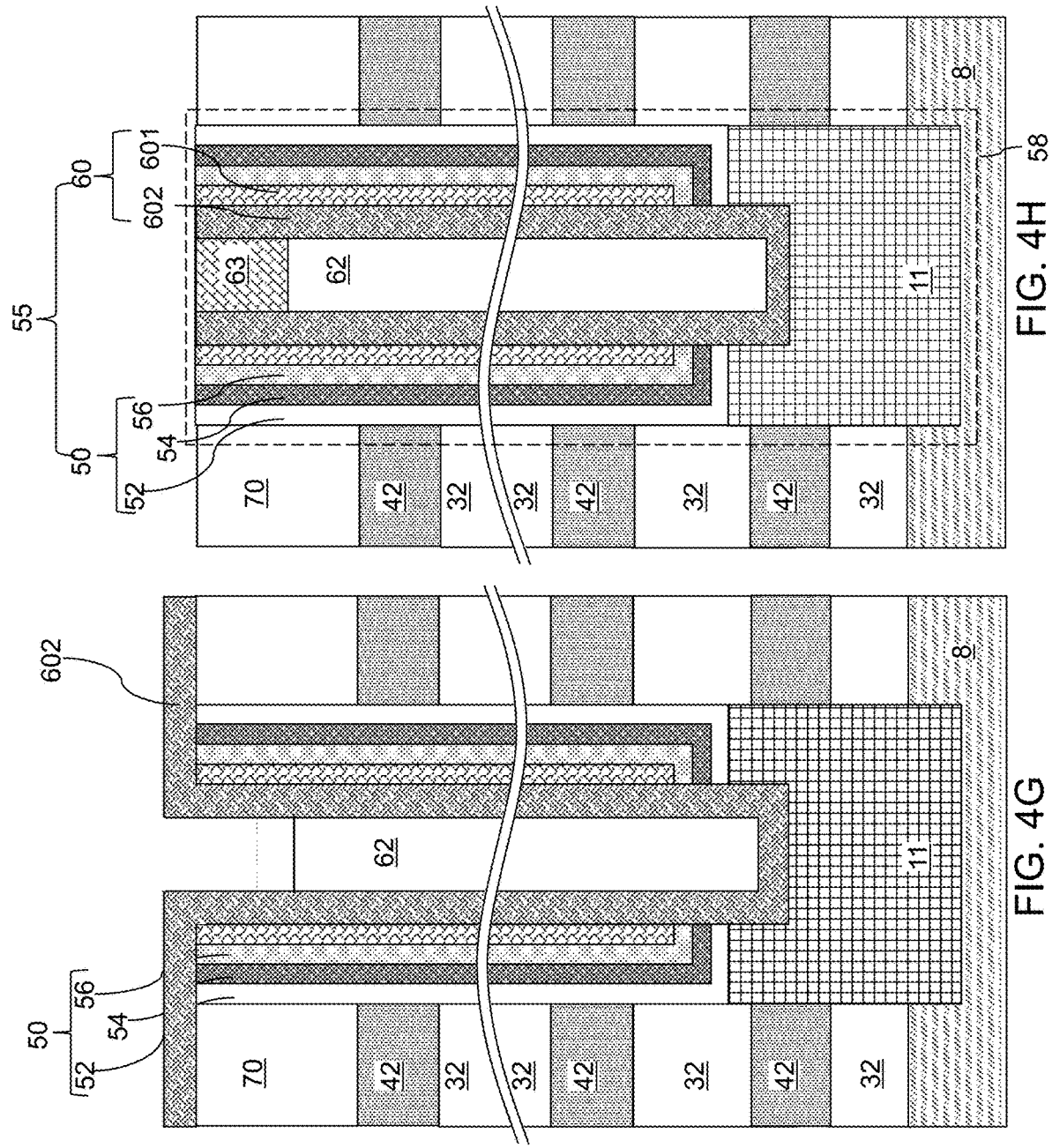

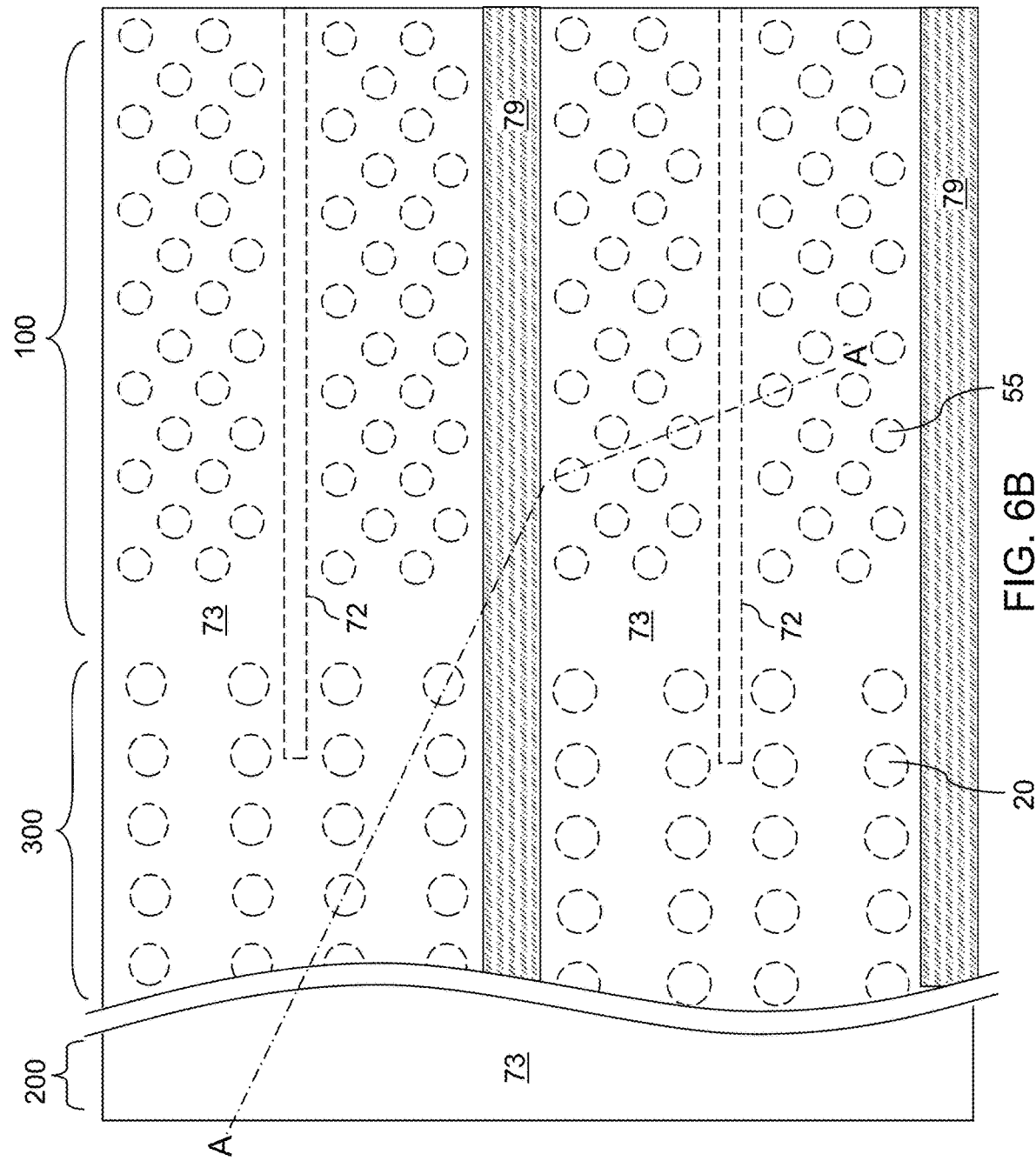

METHOD OF FORMING A THREE-DIMENSIONAL MEMORY DEVICE AND A DRIVER CIRCUIT ON OPPOSITE SIDES OF A SUBSTRATE

FIELD

The present disclosure relates generally to the field of semiconductor devices, and particularly to integration of a three-dimensional memory device and a driver circuit opposite sides of a single semiconductor substrate.

BACKGROUND

A three-dimensional array of memory elements refers to a three-dimensional array of memory elements. For example, a two-dimensional array of vertical NAND strings may be used to provide a three-dimensional array of memory elements. Such a three-dimensional array of memory elements is disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a method of forming a device structure includes forming a memory-level structure including a three-dimensional memory device over a front side surface of a semiconductor substrate, forming memory-side dielectric material layers over the memory-level structure, bonding a handle substrate to the memory-side dielectric material layers, thinning the semiconductor substrate while the handle substrate is attached to the memory-side dielectric material layers, forming a driver circuit including field effect transistors on a backside semiconductor surface of the semiconductor substrate after thinning the semiconductor substrate, and removing the handle substrate from the memory-side dielectric material layers.

BRIEF DESCRIPTION OF THE DRAWINGS

FIG. 2A is a schematic vertical cross-sectional view of the exemplary structure after formation of stepped surfaces and a stepped dielectric material portion according to an embodiment of the present disclosure.

FIGS. 4A-4H are sequential schematic vertical cross-sectional views of a memory opening within the exemplary structure during formation of a memory opening fill structure according to an embodiment of the present disclosure.

FIG. 6B is a partial see-through top-down view of the exemplary structure of FIG. 6A. The vertical plane A-A' is the plane of the schematic vertical cross-sectional view of FIG. 6A.

DETAILED DESCRIPTION

Figure 1:
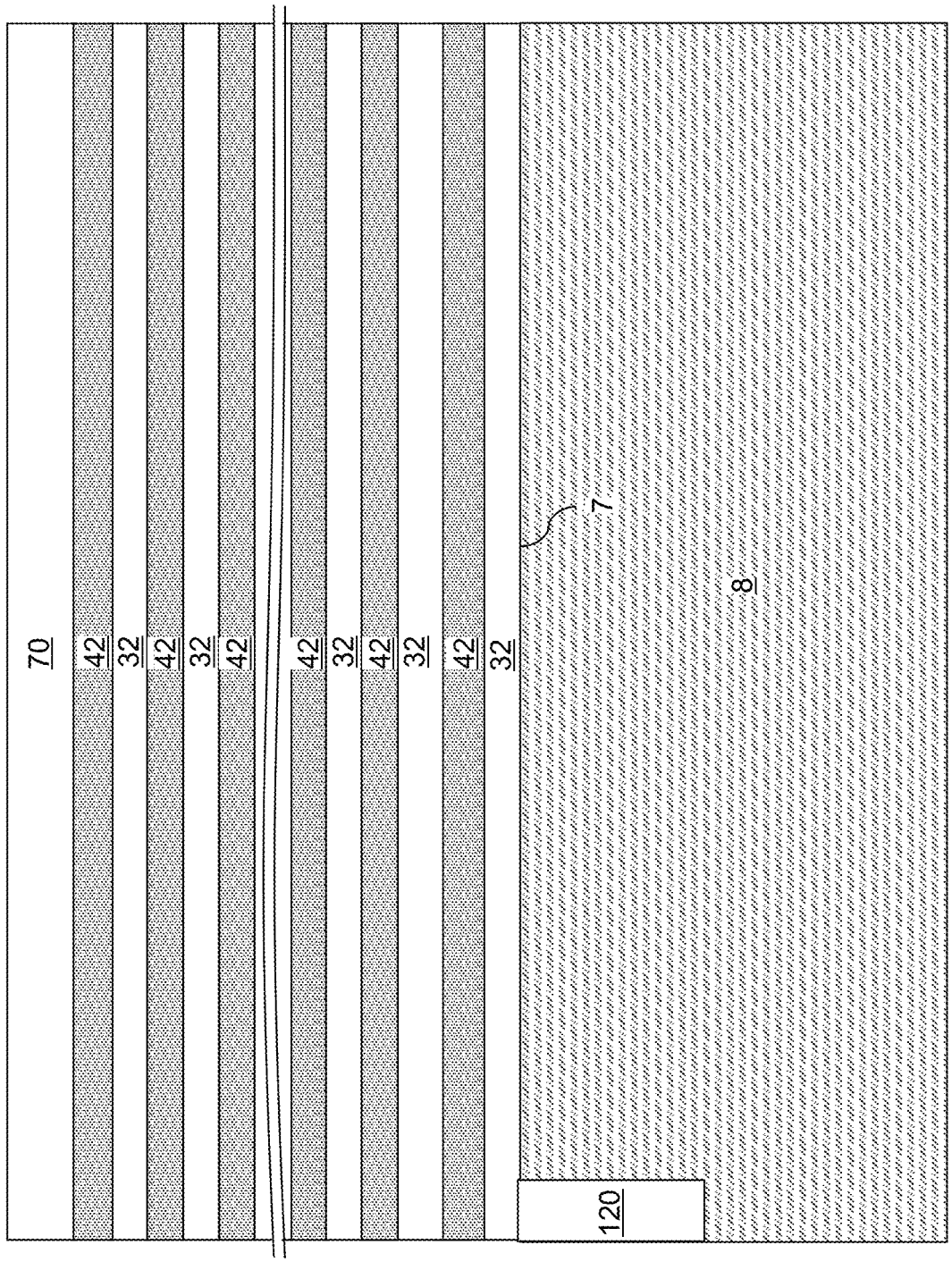
FIG. 1 is a schematic vertical cross-sectional view of an exemplary structure after formation of dielectric isolation structures and an in-process alternating stack of insulating layers and sacrificial material layers according to an embodiment of the present disclosure.

A three-dimensional memory device requires a driver circuit (also referred to as a peripheral or support circuit) for programming, sensing, and erasing operations. If the driver circuit is formed prior to the memory device, then the high temperature processing steps of the memory device may degrade the performance of the driver circuit devices, such as by out diffusion of dopants from the source and drain regions of the driver circuit devices and/or by undesirable diffusion of hydrogen used during deposition of the memory device layers into the driver circuit devices. This degrades the performance of the driver circuit devices, such as CMOS devices, and reduces the input/output speed of these devices. One embodiment of the present disclosure is directed to a method of making a device containing a three-dimensional memory device on a front side of the substrate and driver circuitry on the backside of the substrate, the various aspects of which are described below. In this method, the driver circuit devices may be formed at a relatively low temperature after forming the memory device, which improves the driver circuit performance and speed. The embodiments of the disclosure may be employed to form various structures including a multilevel memory structure, non-limiting examples of which include semiconductor devices such as three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition. As used herein, a first element located "on" a second element may be located on the exterior side of a surface of the second element or on the interior side of the second element. As used herein, a first element is located "directly on" a second element if there exist a physical contact between a surface of the first element and a surface of the second element.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

A monolithic three-dimensional memory array is one in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and may be fabricated employing the various embodiments described herein.

Generally, a semiconductor die, or a semiconductor package, may include be a single memory chip. Each semiconductor package contains one or more dies (for example one, two, or four). The die is the smallest unit that may independently execute commands or report status. Each die contains one or more planes (typically one or two). Identical, concurrent operations may take place on each plane, although with some restrictions. Each plane contains a number of blocks, which are the smallest unit that may be erased by in a single erase operation. Each block contains a number of pages, which are the smallest unit that may be programmed, i.e., a smallest unit on which a read operation may be performed.

Referring to FIG. 1, an exemplary structure according to an embodiment of the present disclosure is illustrated, which may be employed, for example, to fabricate a device structure containing vertical NAND memory devices. The exemplary structure includes a semiconductor substrate 8. The semiconductor substrate 8 maybe a commercially available semiconductor wafer, and may include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate may have a major surface 7, which may be, for example, a topmost surface of the semiconductor substrate 8. The major surface 7 may be a semiconductor surface. In one embodiment, the semiconductor substrate 8 comprises, and may consist of, a single crystalline semiconductor substrate, and the major surface 7 may be a single crystalline semiconductor surface, such as a single crystalline semiconductor surface. In one embodiment, the semiconductor substrate 8 may be a commercially available single crystalline silicon wafer.

As used herein, a "semiconducting material" refers to a material having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0 \times 10^{5}$ S/cm. As used herein, an "insulator material" or a "dielectric material" refers to a material having electrical conductivity less than $1.0 \times 10^{-6}$ S/cm. As used herein, a "heavily doped semiconductor material" refers to a semiconductor material that is doped with electrical dopant at a sufficiently high atomic concentration to become a conductive material, i.e., to have electrical conductivity greater than $1.0 \times 10^{5}$ S/cm. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0 \times 10^{-6}$ S/cm to $1.0 \times 10^{5}$ S/cm. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material may be semiconducting or conductive depending on the atomic concentration of electrical dopants therein. As used herein, a "metallic material" refers to a conductive material including at least one metallic element therein. All measurements for electrical conductivities are made at the standard condition.

In one embodiment, the semiconductor substrate 8 comprises a single crystalline semiconductor material that continuously extends from the front side surface (i.e., the major surface 7) of the semiconductor substrate 8 to a backside surface of the semiconductor substrate 8 that is parallel to the front side surface. In one embodiment, the semiconductor substrate 8 may have a uniform thickness in a range from 300 microns to 1,500 microns, although lesser and greater thicknesses may also be employed.

The exemplary structure may include a memory array region 100 in which memory stack structures are subsequently formed, a staircase region 300 in which stepped surfaces of an alternating stack of material layers are subsequently formed, and a peripheral region 200 in which through-substrate via structures are subsequently formed. In one embodiment, at least one optional memory-side shallow trench isolation structure 120 may be formed in the peripheral region 200 and optionally in areas within the memory array region 100. The at least one memory-side shallow trench isolation structure 120 may be formed, for example, by forming at least one shallow trench extending downward from the top (e.g., front) surface of the semiconductor substrate 8, and by filling the at least one shallow trench with a dielectric fill material such as silicon oxide. Excess portions of the dielectric fill material overlying the front side surface of the semiconductor substrate 8 may be removed by a planarization process such as a chemical mechanical planarization process. Each remaining portion of the dielectric fill material constitutes a memory-side shallow trench isolation structure 120.

Figure 2B:
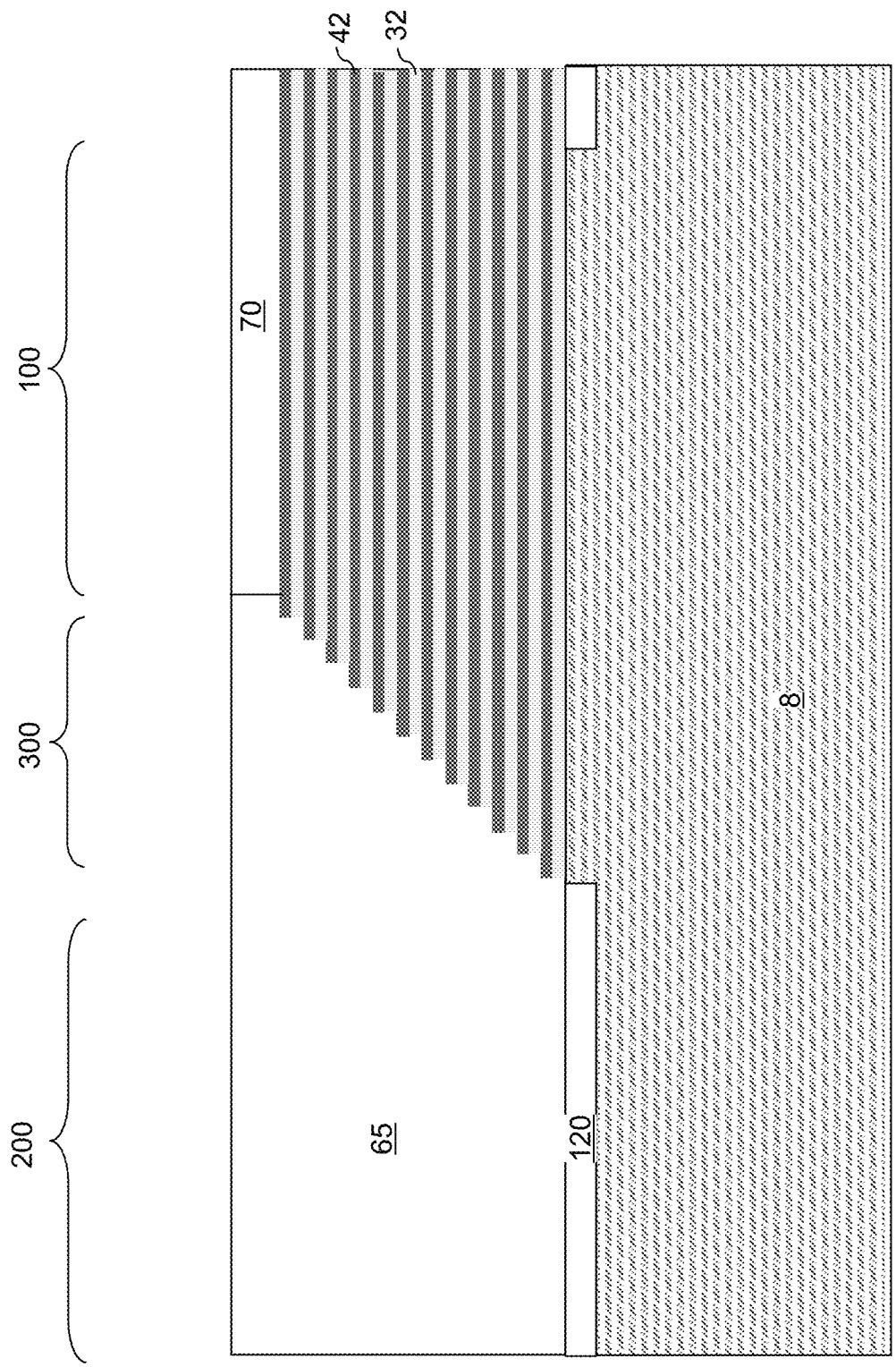
FIG. 2B is another schematic vertical cross-sectional view of the exemplary structure of FIG. 2A.

Referring to FIGS. 2A and 2B, a stack of an alternating plurality of first material layers (which may be insulating layers 32) and second material layers (which may be sacrificial material layer 42) is formed over the front side surface of the semiconductor substrate 8. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer may be an insulating layer 32, and each second material layer may be a sacrificial material layer. In this case, the stack may include an alternating plurality of insulating layers 32 and sacrificial material layers 42, and constitutes a prototype stack of alternating layers comprising insulating layers 32 and sacrificial material layers 42. As used herein, a "prototype" structure or an "in-process" structure refers to a transient structure that is subsequently modified in the shape or composition of at least one component therein.

The stack of the alternating plurality is herein referred to as an alternating stack (32, 42). In one embodiment, the alternating stack (32, 42) may include insulating layers 32 composed of the first material, and sacrificial material layers 42 composed of a second material different from that of insulating layers 32. The first material of the insulating layers 32 may be at least one insulating material. As such, each insulating layer 32 may be an insulating material layer. Insulating materials that may be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 may be silicon oxide.

The second material of the sacrificial material layers 42 is a sacrificial material that may be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 may be subsequently replaced with electrically conductive electrodes which may function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 may be spacer material layers that comprise silicon nitride or a semiconductor material including at least one of silicon and germanium.

In one embodiment, the insulating layers 32 may include silicon oxide, and sacrificial material layers may include silicon nitride sacrificial material layers. The first material of the insulating layers 32 may be deposited, for example, by chemical vapor deposition (CVD). For example, if silicon oxide is employed for the insulating layers 32, tetraethylorthosilicate (TEOS) may be employed as the precursor material for the CVD process. The second material of the sacrificial material layers 42 may be formed, for example, CVD or atomic layer deposition (ALD).

The sacrificial material layers 42 may be suitably patterned so that conductive material portions to be subsequently formed by replacement of the sacrificial material layers 42 may function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 may be in a range from 20 nm to 50 nm, although lesser and greater thicknesses may be employed for each insulating layer 32 and for each sacrificial material layer 42. The number of repetitions of the pairs of an insulating layer 32 and a sacrificial material layer (e.g., a control gate electrode or a sacrificial material layer) 42 may be in a range from 2 to 1,024, and typically from 8 to 256, although a greater number of repetitions may also be employed. The top and bottom gate electrodes in the stack may function as the select gate electrodes. In one embodiment, each sacrificial material layer 42 in the alternating stack (32, 42) may have a uniform thickness that is substantially invariant within each respective sacrificial material layer 42.

The alternating stack of the insulating layers 32 and the sacrificial material layers 42 is an in-process alternating stack that is subsequently modified by replacing the sacrificial material layers with electrically conductive layers. While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers may be omitted.

Optionally, an insulating cap layer 70 may be formed over the alternating stack (32, 42). The insulating cap layer 70 includes a dielectric material that is different from the material of the sacrificial material layers 42. In one embodiment, the insulating cap layer 70 may include a dielectric material that may be employed for the insulating layers 32 as described above. The insulating cap layer 70 may have a greater thickness than each of the insulating layers 32. The insulating cap layer 70 may be deposited, for example, by chemical vapor deposition. In one embodiment, the insulating cap layer 70 may be a silicon oxide layer.

Drain-select-level isolation structures 72 may be optionally formed through the insulating cap layer 72 and at least a topmost one of the sacrificial material layers 42. For example, horizontally-extending trenches may be formed through the insulating cap layer 72 and at least a topmost one of the sacrificial material layers 42, and may be filled with a dielectric fill material to form drain-select-level isolation structures 72.

A stepped cavity may be formed within the staircase region 300 which is located between the device region (e.g., memory array region) 100 and the peripheral region 200 containing connections to the peripheral driver circuitry. The stepped cavity may have various stepped surfaces such that the horizontal cross-sectional shape of the stepped cavity changes in steps as a function of the vertical distance from the front side surface of the semiconductor substrate 8. In one embodiment, the stepped cavity may be formed by repetitively performing a set of processing steps. The set of processing steps may include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure. The lateral extent of the spacer material layers (e.g., the sacrificial material layers 42) decreases with a vertical distance from the front side surface of the semiconductor substrate 8 after formation of the stepped surfaces.

After formation of the stepped cavity, a peripheral portion of the alternating stack (32, 42) may have stepped surfaces after formation of the stepped cavity. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A "stepped cavity" refers to a cavity having stepped surfaces.

A terrace region is formed by patterning the alternating stack (32, 42). Each sacrificial material layer 42 other than a topmost sacrificial material layer 42 within the alternating stack (32, 42) laterally extends farther than any overlying sacrificial material layer 42 within the alternating stack (32, 42). The terrace region includes stepped surfaces of the alternating stack (32, 42) that continuously extend from a bottommost layer within the alternating stack (32, 42) to a topmost layer within the alternating stack (32, 42).

A stepped dielectric material portion 65 (i.e., an insulating fill material portion) may be formed in the stepped cavity by deposition of a dielectric material therein. For example, a dielectric material such as silicon oxide may be deposited in the stepped cavity. Excess portions of the deposited dielectric material may be removed from above the top surface of the insulating cap layer 70, for example, by chemical mechanical planarization (CMP). The remaining portion of the deposited dielectric material filling the stepped cavity constitutes the stepped dielectric material portion 65. As used herein, a "stepped" element refers to an element that has stepped surfaces and a horizontal cross-sectional area that increases monotonically as a function of a vertical distance from a top surface of a substrate on which the element is present. If silicon oxide is employed for the stepped dielectric material portion 65, the silicon oxide of the stepped dielectric material portion 65 may, or may not, be doped with dopants such as B, P, and/or F.

Figure 3A:
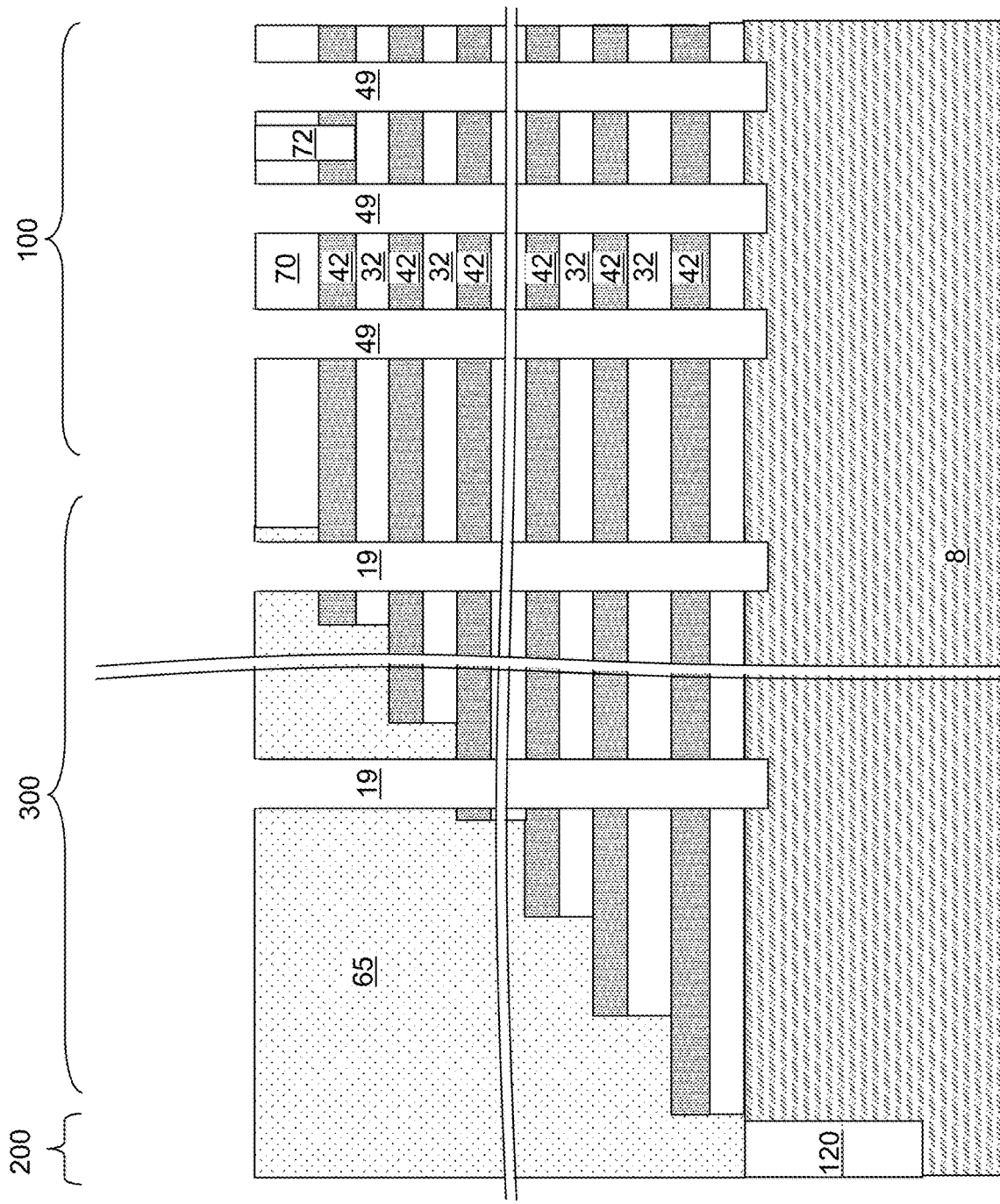
FIG. 3A is a schematic vertical cross-sectional view of the exemplary structure after formation of memory openings and support openings according to an embodiment of the present disclosure.
Figure 3B:
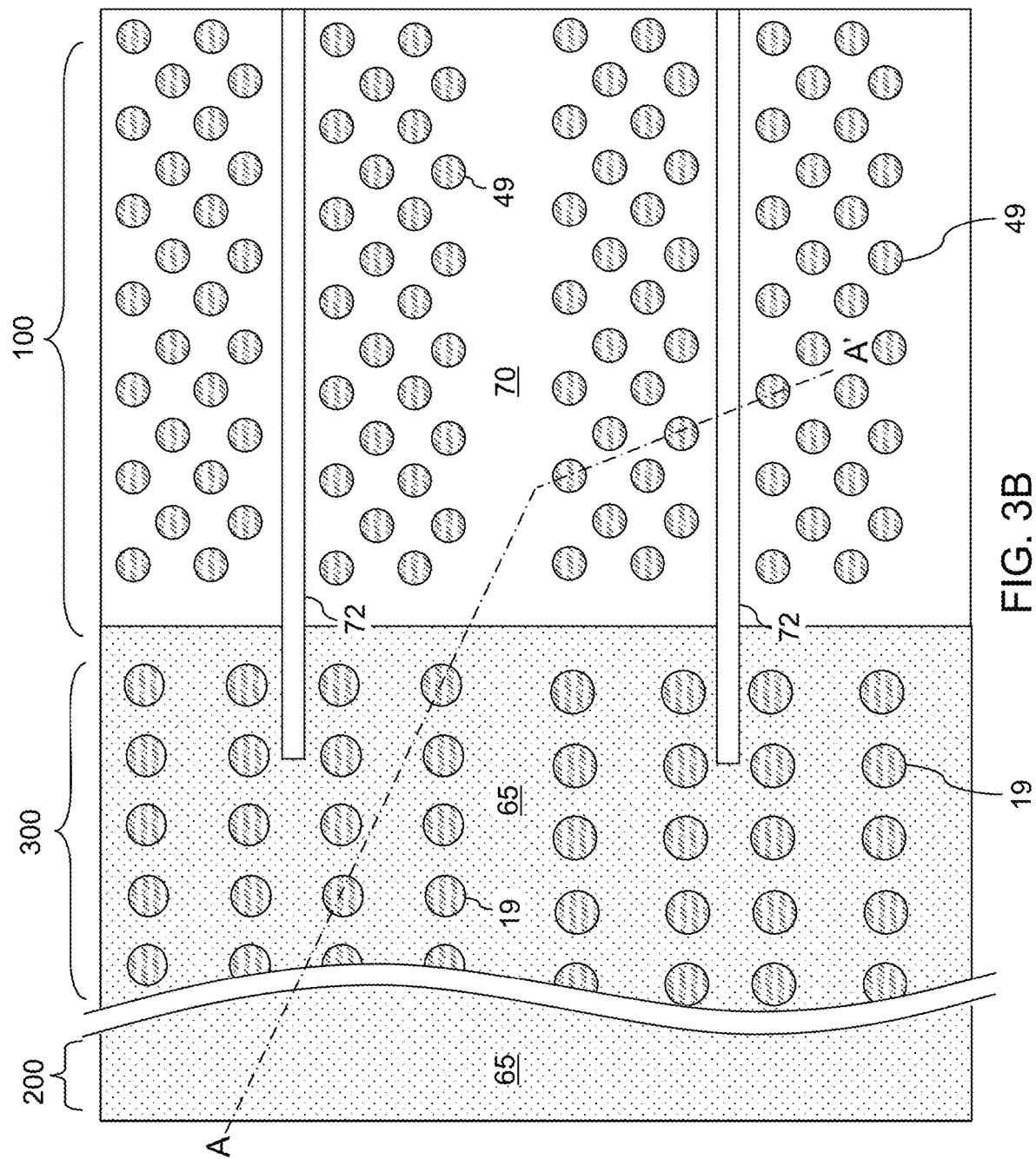
FIG. 3B is a top-down view of the exemplary structure of FIG. 3A. The vertical plane A-A' is the plane of the cross-section for FIG. 3A.

Referring to FIGS. 3A and 3B, a lithographic material stack (not shown) including at least a photoresist layer may be formed over the insulating cap layer 70 and the stepped dielectric material portion 65, and may be lithographically patterned to form openings therein. The openings include a first set of openings formed over the memory array region 100 and a second set of openings formed over the staircase region 300. The pattern in the lithographic material stack may be transferred through the insulating cap layer 70 or the stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) may alternate to optimize etching of the first and second materials in the alternating stack (32, 42). The anisotropic etch may be, for example, a series of reactive ion etches. The sidewalls of the memory openings 49 and the support openings 19 may be substantially vertical, or may be tapered. The patterned lithographic material stack may be subsequently removed, for example, by ashing.

The memory openings 49 and the support openings 19 may extend from the top surface of the alternating stack (32, 42) to at least the horizontal plane including the topmost surface of the semiconductor substrate 8. In one embodiment, an overetch into the semiconductor substrate 8 may be optionally performed after the top surface of the semiconductor substrate 8 is physically exposed at a bottom of each memory opening 49 and each support opening 19. The overetch may be performed prior to, or after, removal of the lithographic material stack. In other words, the recessed surfaces of the semiconductor substrate 8 may be vertically offset from the un-recessed top surfaces of the semiconductor substrate 8 by a recess depth. The recess depth may be, for example, in a range from 1 nm to 50 nm, although lesser and greater recess depths may also be employed. The overetch is optional, and may be omitted. If the overetch is not performed, the bottom surfaces of the memory openings 49 and the support openings 19 may be coplanar with the topmost surface of the semiconductor substrate 8.

Each of the memory openings 49 and the support openings 19 may include a sidewall (or a plurality of sidewalls) that extends substantially perpendicular to the topmost surface of the substrate. A two-dimensional array of memory openings 49 may be formed in the memory array region 100.

A two-dimensional array of support openings 19 may be formed in the staircase region 300.

FIGS. 4A-4H illustrate structural changes in a memory opening 49, which is one of the memory openings 49 in the exemplary structure of FIGS. 3A and 3B. The same structural change occurs simultaneously in each of the other memory openings 49 and in each support opening 19.

Referring to FIG. 4A, a memory opening 49 in the exemplary device structure of FIGS. 3A and 3B is illustrated. The memory opening 49 extends through the insulating cap layer 70, the alternating stack (32, 42), and optionally into an upper portion of the semiconductor substrate 8. At this processing step, each support opening 19 may extend through the stepped dielectric material portion 65, a subset of layers in the alternating stack (32, 42), and optionally through the upper portion of the semiconductor substrate 8. The recess depth of the bottom surface of each memory opening with respect to the top surface of the semiconductor substrate 8 may be in a range from 0 nm to 30 nm, although greater recess depths may also be employed. Optionally, the sacrificial material layers 42 may be laterally recessed partially to form lateral recesses (not shown), for example, by an isotropic etch.

Referring to FIG. 4B, an optional pedestal channel portion (e.g., an epitaxial pedestal) 11 may be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor substrate 8. In one embodiment, the pedestal channel portion 11 may be doped with electrical dopants of the same conductivity type as the semiconductor substrate 8. In one embodiment, the top surface of each pedestal channel portion 11 may be formed above a horizontal plane including the top surface of a sacrificial material layer 42. In this case, at least one source select gate electrode may be subsequently formed by replacing each sacrificial material layer 42 located below the horizontal plane including the top surfaces of the pedestal channel portions 11 with a respective conductive material layer. The pedestal channel portion 11 may be a portion of a transistor channel that extends between a source region to be subsequently formed in the semiconductor substrate 8 and a drain region to be subsequently formed in an upper portion of the memory opening 49. A memory cavity 49' is present in the unfilled portion of the memory opening 49 above the pedestal channel portion 11. In one embodiment, the pedestal channel portion 11 may comprise single crystalline silicon. In one embodiment, the pedestal channel portion 11 may have a doping of the first conductivity type, which is the same as the conductivity type of the semiconductor substrate 8 that the pedestal channel portion contacts.

Referring to FIG. 4C, a stack of layers including a blocking dielectric layer 52, a charge storage layer 54, a tunneling dielectric layer 56, and an optional first semiconductor channel layer 601 may be sequentially deposited in the memory openings 49.

The blocking dielectric layer 52 may include a single dielectric material layer or a stack of a plurality of dielectric material layers. In one embodiment, the blocking dielectric layer may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride.

Non-limiting examples of dielectric metal oxides include aluminum oxide ($Al_2O_3$), hafnium oxide ($HfO_2$), lanthanum oxide ($LaO_2$), yttrium oxide ($Y_2O_3$), tantalum oxide ($Ta_2O_5$), silicates thereof, nitrogen-doped compounds thereof, alloys thereof, and stacks thereof. The dielectric metal oxide layer may be deposited, for example, by chemical vapor deposition (CVD), atomic layer deposition (ALD), pulsed laser deposition (PLD), liquid source misted chemical deposition, or a combination thereof. The thickness of the dielectric metal oxide layer may be in a range from 1 nm to 20 nm, although lesser and greater thicknesses may also be employed. The dielectric metal oxide layer may subsequently function as a dielectric material portion that blocks leakage of stored electrical charges to control gate electrodes. In one embodiment, the blocking dielectric layer 52 includes aluminum oxide. In one embodiment, the blocking dielectric layer 52 may include multiple dielectric metal oxide layers having different material compositions.

Alternatively or additionally, the blocking dielectric layer 52 may include a dielectric semiconductor compound such as silicon oxide, silicon oxynitride, silicon nitride, or a combination thereof. In one embodiment, the blocking dielectric layer 52 may include silicon oxide. In this case, the dielectric semiconductor compound of the blocking dielectric layer 52 may be formed by a conformal deposition method such as low pressure chemical vapor deposition, atomic layer deposition, or a combination thereof. The thickness of the dielectric semiconductor compound may be in a range from 1 nm to 20 nm, although lesser and greater thicknesses may also be employed. Alternatively, the blocking dielectric layer 52 may be omitted, and a backside blocking dielectric layer may be formed after formation of backside recesses on surfaces of memory films to be subsequently formed.

Subsequently, the charge storage layer 54 may be formed. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 may have vertically coincident sidewalls, and the charge storage layer 54 may be formed as a single continuous layer.

In another embodiment, the sacrificial material layers 42 may be laterally recessed with respect to the sidewalls of the insulating layers 32, and a combination of a deposition process and an anisotropic etch process may be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which may be charge trapping material portions or electrically isolated conductive material portions) that are vertically spaced apart.

The charge storage layer 54 may be formed as a single charge storage layer of homogeneous composition, or may include a stack of multiple charge storage layers. The multiple charge storage layers, if employed, may comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which may be, for example, ruthenium nanoparticles. The charge storage layer 54 may be formed, for example, by chemical vapor deposition (CVD), atomic layer deposition (ALD), physical vapor deposition (PVD), or any suitable deposition technique for storing electrical charges therein. The thickness of the charge storage layer 54 may be in a range from 2 nm to 20 nm, although lesser and greater thicknesses may also be employed.

The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 may be formed by a conformal deposition method such as low pressure chemical vapor deposition (LPCVD). The thickness of the first semiconductor channel layer 601 may be in a range from 2 nm to 10 nm, although lesser and greater thicknesses may also be employed. A memory cavity 49' is formed in the volume of each memory opening 49 that is not filled with the deposited material layers (52, 54, 56, 601).

Referring to FIG. 4D, the optional first semiconductor channel layer 601, the tunneling dielectric layer 56, the charge storage layer 54, the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 may be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' may be removed to form openings in remaining portions thereof. Each of the first semiconductor channel layer 601, the tunneling dielectric layer 56, the charge storage layer 54, and the blocking dielectric layer 52 may be etched by a respective anisotropic etch process employing a respective etch chemistry, which may, or may not, be the same for the various material layers.

Each remaining portion of the first semiconductor channel layer 601 may have a tubular configuration. The charge storage layer 54 may comprise a charge trapping material or a floating gate material. In one embodiment, each charge storage layer 54 may include a vertical stack of charge storage regions that store electrical charges upon programming. In one embodiment, the charge storage layer 54 may be a charge storage layer in which each portion adjacent to the sacrificial material layers 42 constitutes a charge storage region.

A surface of the pedestal channel portion 11 (or a surface of the semiconductor substrate 8 in case the pedestal channel portions 11 are not employed) may be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' may be vertically recessed so that the recessed semiconductor surface underneath the memory cavity 49' is vertically offset from the topmost surface of the pedestal channel portion 11 (or of the semiconductor substrate 8 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 may have vertically coincident sidewalls.

Figure 4E:
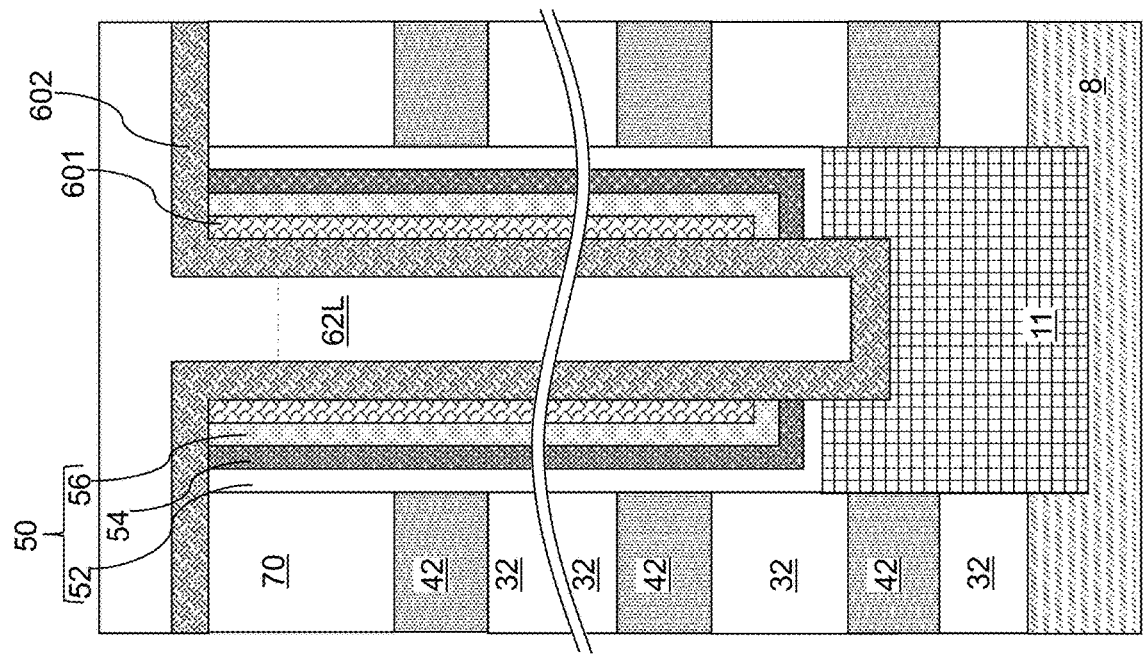

Referring to FIG. 4E, a second semiconductor channel layer 602 may be deposited directly on the semiconductor surface of the pedestal channel portion 11 or the semiconductor substrate 8 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 may be formed by a conformal deposition method such as low pressure chemical vapor deposition (LPCVD). The thickness of the second semiconductor channel layer 602 may be in a range from 2 nm to 10 nm, although lesser and greater thicknesses may also be employed. The second semiconductor channel layer 602 may partially fill the memory cavity 49' in each memory opening, or may fully fill the cavity in each memory opening.

The materials of the first semiconductor channel layer 601 and the second semiconductor channel layer 602 are collectively referred to as a semiconductor channel material. In other words, the semiconductor channel material is a set of all semiconductor material in the first semiconductor channel layer 601 and the second semiconductor channel layer 602.

Figure 4F:
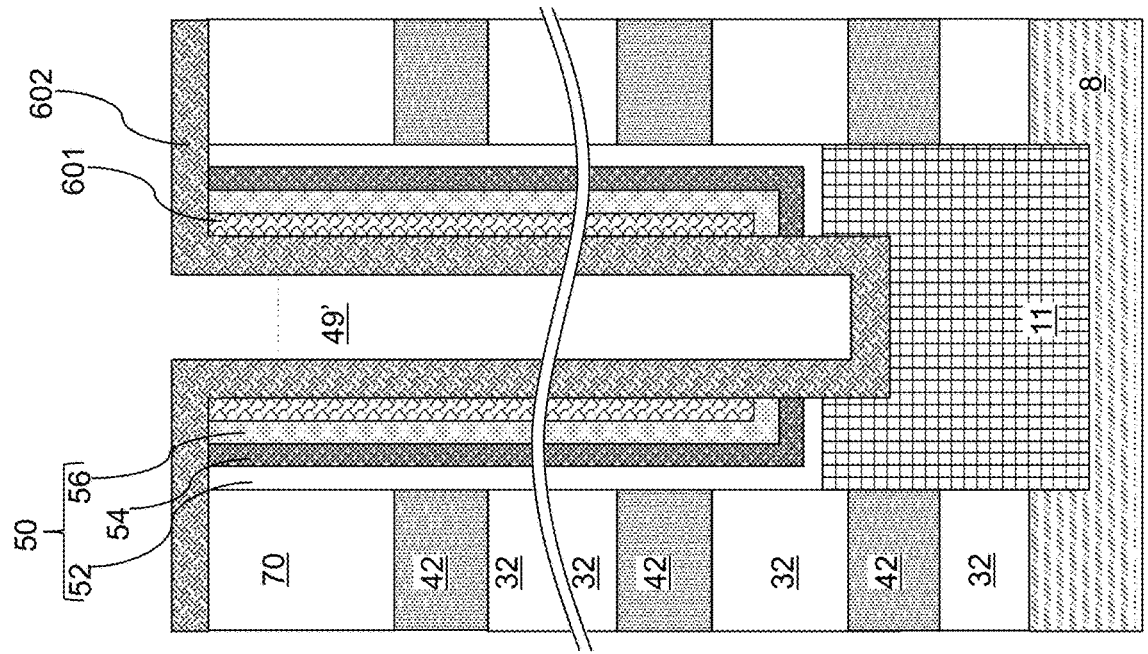

Referring to FIG. 4F, in case the memory cavity 49' in each memory opening is not completely filled by the second semiconductor channel layer 602, a dielectric core layer 62L may be deposited in the memory cavity 49' to fill any remaining portion of the memory cavity 49' within each memory opening. The dielectric core layer 62L includes a dielectric material such as silicon oxide or organosilicate glass. The dielectric core layer 62L may be deposited by a conformal deposition method such as low pressure chemical vapor deposition (LPCVD), or by a self-planarizing deposition process such as spin coating.

Referring to FIG. 4G, the horizontal portion of the dielectric core layer 62L may be removed, for example, by a recess etch from above the top surface of the second semiconductor channel layer 602. Further, the material of the dielectric core layer 62L may be vertically recessed selective to the semiconductor material of the second semiconductor channel layer 602 into each memory opening 49 down to a depth between a first horizontal plane including the top surface of the insulating cap layer 70 and a second horizontal plane including the bottom surface of the insulating cap layer 70. Each remaining portion of the dielectric core layer 62L constitutes a dielectric core 62.

Referring to FIG. 4H, a doped semiconductor material having a doping of a second conductivity type may be deposited within each recessed region above the dielectric cores 62. The second conductivity type is the opposite of the first conductivity type. For example, if the first conductivity type is p-type, the second conductivity type is n-type, and vice versa. The dopant concentration of the doped semiconductor material may be in a range from $5.0 \times 10^{19}/cm^3$ to $2.0 \times 10^{21}/cm^3$, although lesser and greater dopant concentrations may also be employed. The doped semiconductor material may be, for example, doped polysilicon.

Excess portions of the deposited semiconductor material may be removed from above the top surface of the insulating cap layer 70, for example, by chemical mechanical planarization (CMP) or a recess etch. Each remaining portion of the semiconductor material having a doping of the second conductively type constitutes a drain region 63. The horizontal portion of the second semiconductor channel layer 602 located above the top surface of the insulating cap layer 70 may be concurrently removed by a planarization process. Each remaining portion of the second semiconductor channel layer 602 may be located entirety within a memory opening 49 or entirely within a support opening 19.

Each remaining portion of the doped semiconductor material having a doping of the second conductivity type constitutes a drain region 63. Each adjoining pair of a first semiconductor channel layer 601 and a second semiconductor channel layer 602 may collectively form a vertical semiconductor channel 60 through which electrical current may flow when a vertical NAND device including the vertical semiconductor channel 60 is turned on. A tunneling dielectric layer 56 is surrounded by a charge storage layer 54, and laterally surrounds a portion of the vertical semiconductor channel 60. Each adjoining set of a tunneling dielectric layer 56, a charge storage layer 54, and a blocking dielectric layer 52 collectively constitute a memory film 50, which includes a vertical stack of memory elements that may store a respective data bit with a macroscopic retention time. As used herein, a macroscopic retention time refers to a retention time suitable for operation of a memory device as a permanent memory device such as a retention time in excess of 24 hours. In alternative embodiments, a backside gate dielectric layer 52 may not be formed in each memory opening 49, and may be subsequently formed in backside recesses that are formed by removal of the sacrificial material layers 42 at a subsequent processing step.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements as embodied as portions of the charge storage layer 54, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 5:
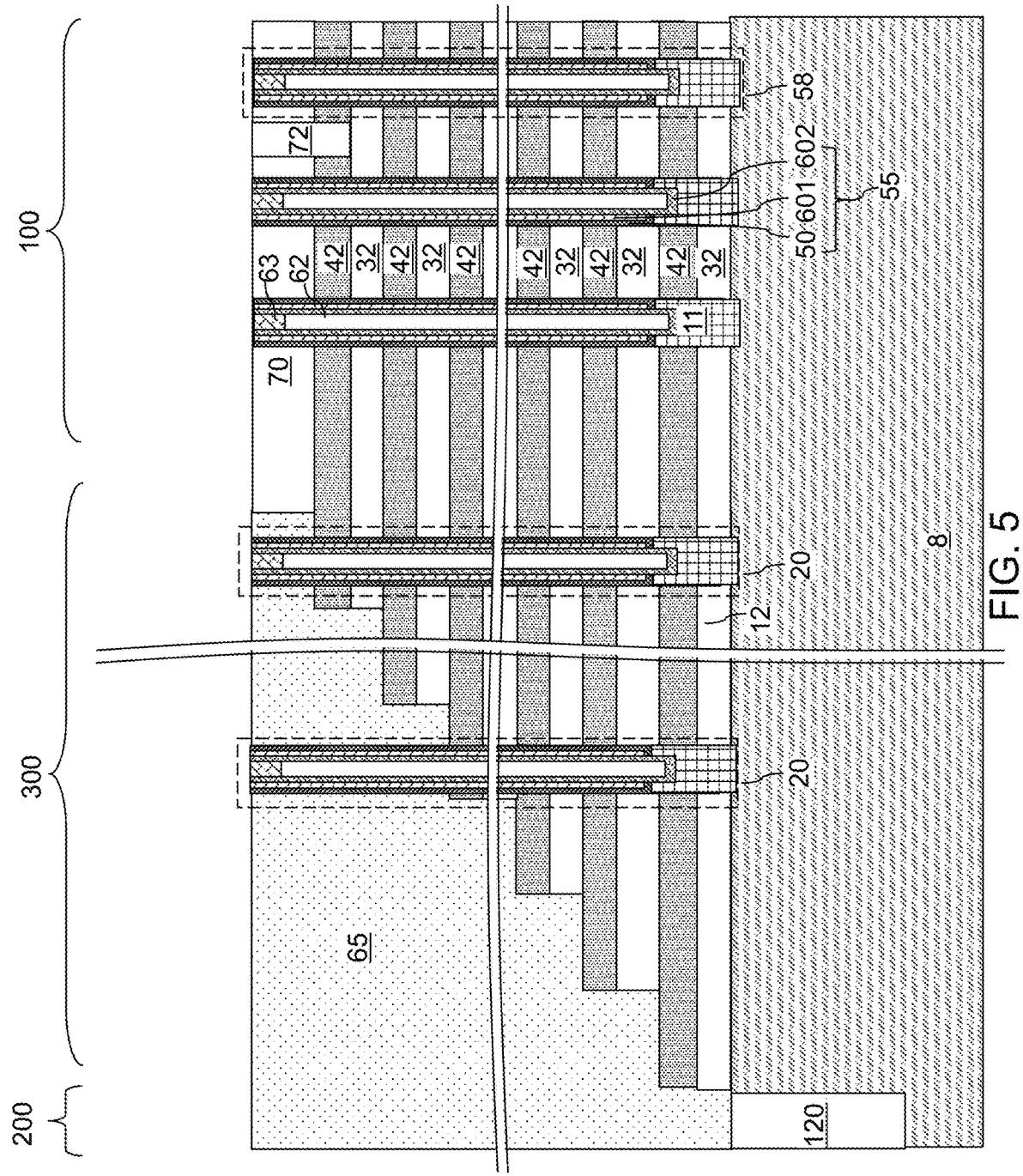
FIG. 5 is a schematic vertical cross-sectional view of the exemplary structure after formation of memory stack structures and support pillar structures according to an embodiment of the present disclosure.

Referring to FIG. 5, the exemplary structure is illustrated after formation of memory opening fill structures 58 and support pillar structure 20 within the memory openings 49 and the support openings 19, respectively. An instance of a memory opening fill structure 58 may be formed within each memory opening 49 of the structure of FIGS. 3A and 3B. An instance of the support pillar structure 20 may be formed within each support opening 19 of the structure of FIGS. 3A and 3B. Each combination of a pedestal channel portion 11 (if present), a memory stack structure 55, a dielectric core 62, and a drain region 63 that is formed within a memory opening 49 is herein referred to as a memory opening fill structure 58. Each combination of a pedestal channel portion 11 (if present), a memory film 50, a vertical semiconductor channel 60, a dielectric core 62, and a drain region 63 that is formed within each support opening 19 fills the respective support openings 19, and constitutes a support pillar structure 20.

Each memory stack structure 55 includes a vertical semiconductor channel 60, which may comprise multiple semiconductor channel layers (601, 602), and a memory film 50. The memory film 50 may comprise a tunneling dielectric layer 56 laterally surrounding the vertical semiconductor channel 60 and a vertical stack of charge storage regions laterally surrounding the tunneling dielectric layer 56 (as embodied as a memory material layer 54) and an optional blocking dielectric layer 52. While the present disclosure is described employing the illustrated configuration for the memory stack structure, the methods of the present disclosure may be applied to alternative memory stack structures including different layer stacks or structures for the memory film 50 and/or for the vertical semiconductor channel 60.

Each portion of a memory film 50 located at a level of a sacrificial material layer 42 include a respective memory element. For example, each portion of a charge storage layer 54 located at a level of a sacrificial material layer 42 may constitute a memory element that may store a data bit by storing, or not storing, electrical charges. Thus, the exemplary structure includes a three-dimensional array of memory elements formed over the semiconductor substrate 8.

Figure 6A:
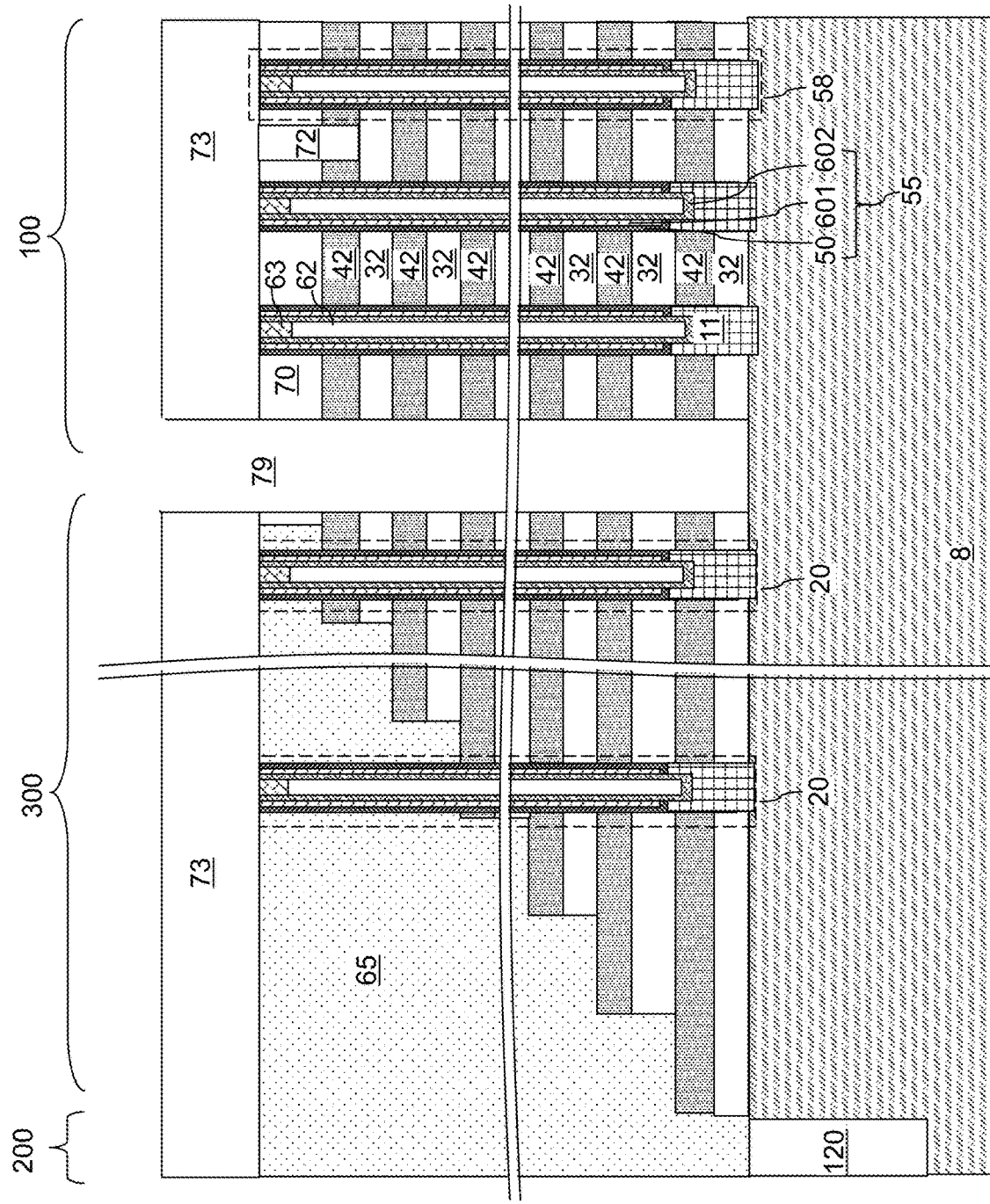
FIG. 6A is a schematic vertical cross-sectional view of the exemplary structure after formation of backside trenches according to an embodiment of the present disclosure.

Referring to FIGS. 6A and 6B, a contact-level dielectric layer 73 may be formed over the alternating stack (32, 42) of insulating layer 32 and sacrificial material layers 42, and over the memory stack structures 55 and the support pillar structures 20. The contact-level dielectric layer 73 includes a dielectric material that is different from the dielectric material of the sacrificial material layers 42. For example, the contact-level dielectric layer 73 may include silicon oxide. The contact-level dielectric layer 73 may have a thickness in a range from 50 nm to 500 nm, although lesser and greater thicknesses may also be employed.

A photoresist layer (not shown) may be applied over the contact-level dielectric layer 73, and is lithographically patterned to form openings in areas between clusters of memory stack structures 55. The pattern in the photoresist layer may be transferred through the contact-level dielectric layer 73, the alternating stack (32, 42) and/or the stepped dielectric material portion 65 employing an anisotropic etch to form backside trenches 79, which vertically extend from the top surface of the contact-level dielectric layer 73 at least to the top surface of the semiconductor substrate 8, and laterally extend through the memory array region 100 and the staircase region 300. In one embodiment, the backside trenches 79 may include a source contact opening in which a source contact via structure may be subsequently formed. The photoresist layer may be removed, for example, by ashing.

Figure 7:
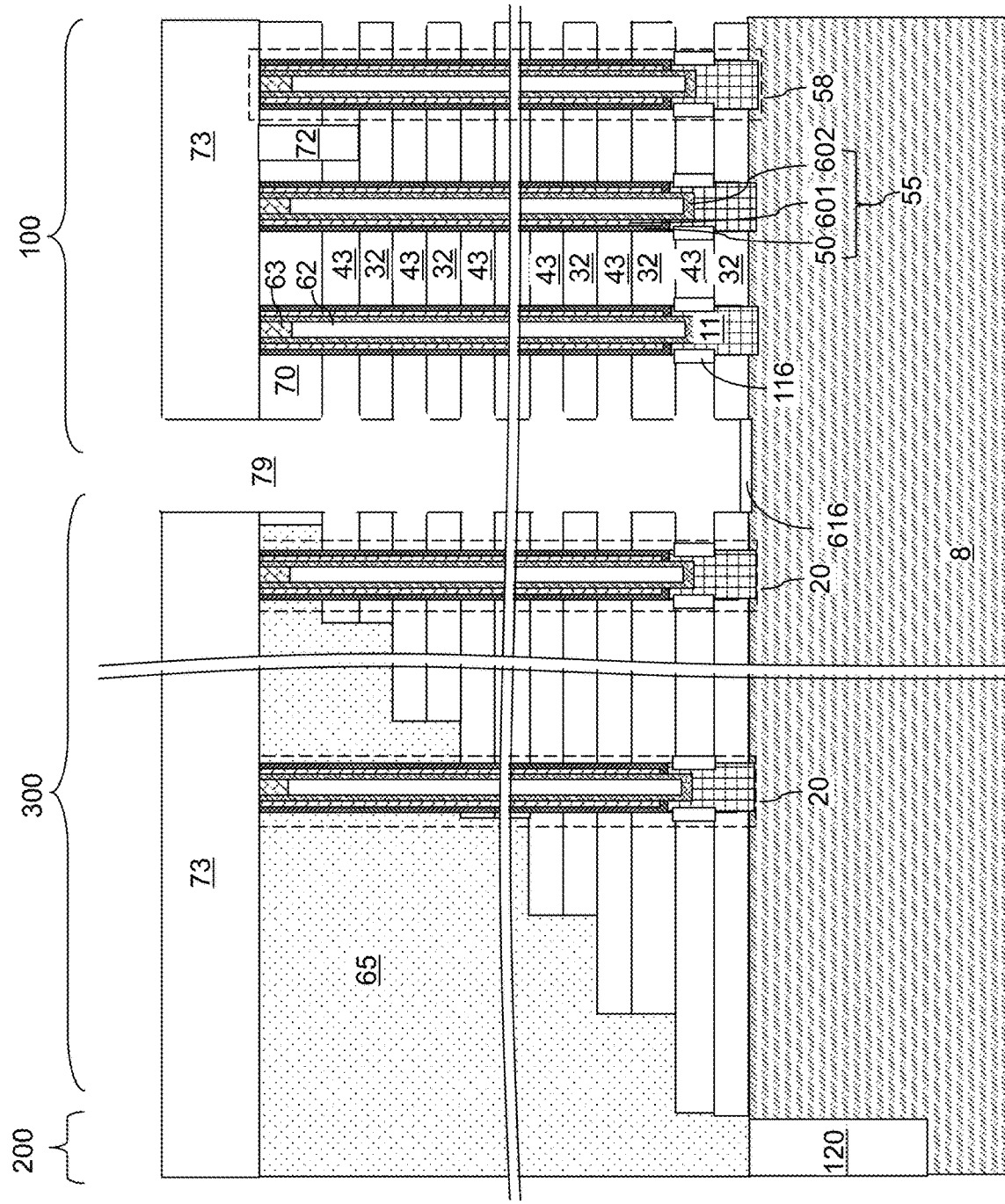
FIG. 7 is a schematic vertical cross-sectional view of the exemplary structure after formation of backside recesses according to an embodiment of the present disclosure.

Referring to FIG. 7, an etchant that selectively etches the second material of the sacrificial material layers 42 with respect to the first material of the insulating layers 32 may be introduced into the backside trenches 79, for example, employing an etch process. Backside recesses 43 are formed in volumes from which the sacrificial material layers 42 are removed. The removal of the second material of the sacrificial material layers 42 may be selective to the first material of the insulating layers 32, the material of the stepped dielectric material portion 65, the semiconductor material of the semiconductor substrate 8, and the material of the outermost layer of the memory films 50. In one embodiment, the sacrificial material layers 42 may include silicon nitride, and the materials of the insulating layers 32 and the stepped dielectric material portion 65 may be selected from silicon oxide and dielectric metal oxides.

The etch process that removes the second material selective to the first material and the outermost layer of the memory films 50 may be a wet etch process employing a wet etch solution, or may be a gas phase (dry) etch process in which the etchant is introduced in a vapor phase into the backside trenches 79. For example, if the sacrificial material layers 42 include silicon nitride, the etch process may be a wet etch process in which the exemplary structure is immersed within a wet etch tank including phosphoric acid, which etches silicon nitride selective to silicon oxide, silicon, and various other materials employed in the art. The support pillar structure 20, the stepped dielectric material portion 65, and the memory stack structures 55 provide structural support while the backside recesses 43 are present within volumes previously occupied by the sacrificial material layers 42.

Each backside recess 43 may be a laterally extending cavity having a lateral dimension that is greater than the vertical extent of the cavity. In other words, the lateral dimension of each backside recess 43 may be greater than the height of the backside recess 43. A plurality of backside recesses 43 may be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the semiconductor substrate 8. In this case, each backside recess 43 may define a space for receiving a respective word line of the array of monolithic three-dimensional NAND strings.

Each of the plurality of backside recesses 43 may extend substantially parallel to the top surface of the semiconductor substrate 8. A backside recess 43 may be vertically bounded by a top surface of an underlying insulating layer 32 and a bottom surface of an overlying insulating layer 32. In one embodiment, each backside recess 43 may have a uniform height throughout.

Physically exposed surface portions of the optional pedestal channel portions 11 and the semiconductor substrate 8 may be converted into dielectric material portions by thermal conversion and/or plasma conversion of the semiconductor materials into dielectric materials. For example, thermal conversion and/or plasma conversion may be employed to convert a surface portion of each pedestal channel portion 11 into a tubular dielectric spacer 116, and to convert each physically exposed surface portion of the semiconductor substrate 8 into a planar dielectric portion 616. In one embodiment, each tubular dielectric spacer 116 may be topologically homeomorphic to a torus, i.e., generally ring-shaped. As used herein, an element is topologically homeomorphic to a torus if the shape of the element may be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 may include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 may include a dielectric oxide, a dielectric nitride, or a dielectric oxynitride of the semiconductor material of the semiconductor substrate 8.

Figure 8:
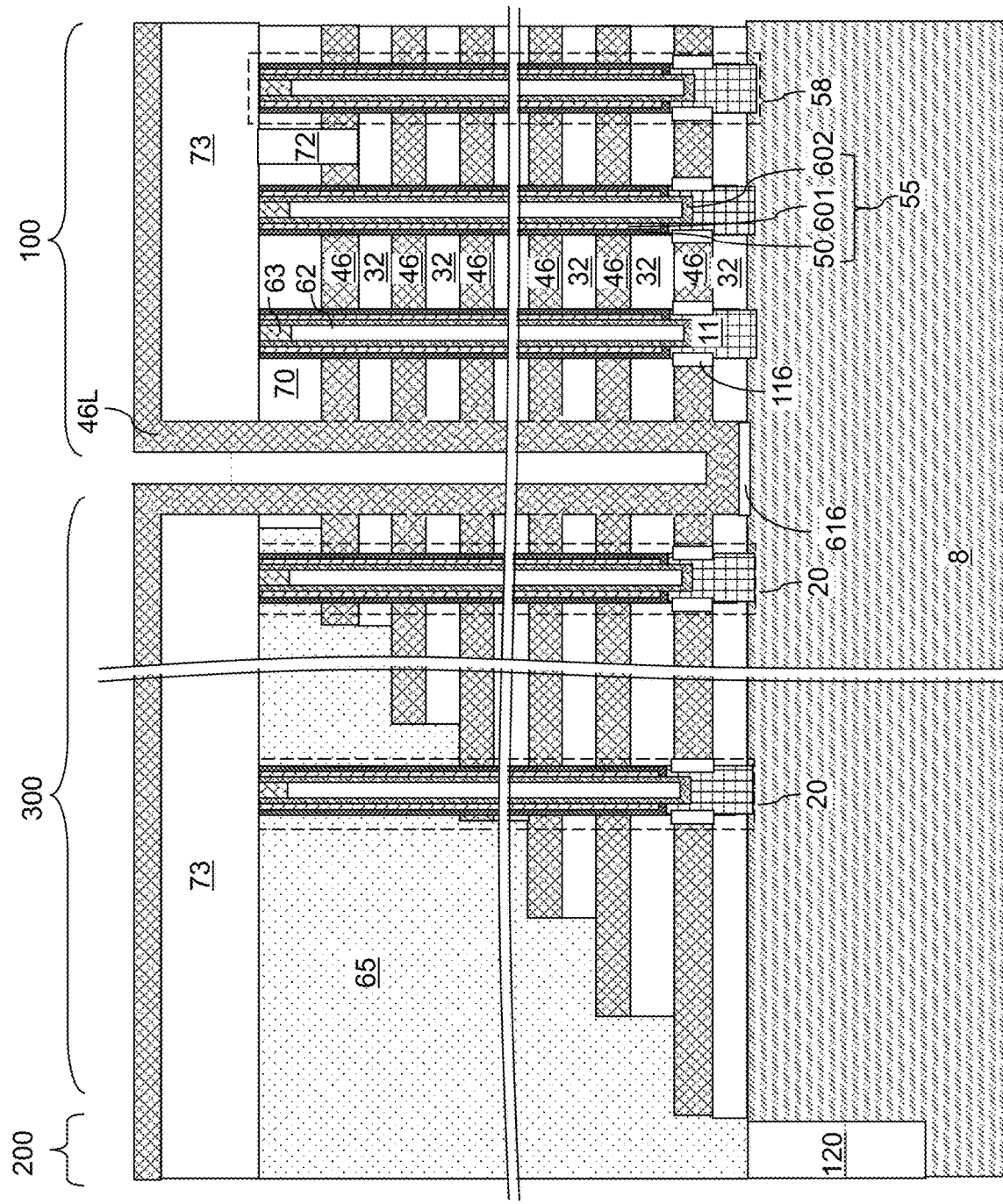
FIG. 8 is a schematic vertical cross-sectional view of the exemplary structure after formation of electrically conductive layers according to an embodiment of the present disclosure.

Referring to FIG. 8, a backside blocking dielectric layer (not expressly shown) may be optionally formed. The backside blocking dielectric layer, if present, comprises a dielectric material that functions as a control gate dielectric for the control gates to be subsequently formed in the backside recesses 43. In case the blocking dielectric layer 52 is present within each memory opening, the backside blocking dielectric layer is optional. In case the blocking dielectric layer 52 is omitted, the backside blocking dielectric layer is present.

At least one metallic material may be deposited in the backside recesses 43. The at least one metallic material may include, for example, a metallic barrier layer and a metal fill material. The metallic barrier layer includes an electrically conductive metallic material that may function as a diffusion barrier layer and/or adhesion promotion layer for a metallic fill material to be subsequently deposited. The metallic barrier layer may include a conductive metallic nitride material such as TiN, TaN, WN, or a stack thereof, or may include a conductive metallic carbide material such as TiC, TaC, WC, or a stack thereof. In one embodiment, the metallic barrier layer may be deposited by a conformal deposition process such as chemical vapor deposition (CVD) or atomic layer deposition (ALD). The thickness of the metallic barrier layer may be in a range from 2 nm to 8 nm, such as from 3 nm to 6 nm, although lesser and greater thicknesses may also be employed. In one embodiment, the metallic barrier layer may consist essentially of a conductive metal nitride such as TiN.

A metal fill material is deposited in the plurality of backside recesses 43, on the sidewalls of the at least one the backside trench 79, and over the top surface of the contact-level dielectric layer 73 to form a metallic fill material layer. The metallic fill material may be deposited by a conformal deposition method, which may be, for example, chemical vapor deposition (CVD), atomic layer deposition (ALD), electroless plating, electroplating, or a combination thereof. In one embodiment, the metallic fill material layer may consist essentially of at least one elemental metal. The at least one elemental metal of the metallic fill material layer may be selected, for example, from tungsten, cobalt, ruthenium, titanium, and tantalum. In one embodiment, the metallic fill material layer may consist essentially of a single elemental metal. In one embodiment, the metallic fill material layer may be deposited employing a fluorine-containing precursor gas such as $WF_6$. In one embodiment, the metallic fill material layer may be a tungsten layer including a residual level of fluorine atoms as impurities. The metallic fill material layer is spaced from the insulating layers 32 and the memory stack structures 55 by the metallic barrier layer, which is a metallic barrier layer that blocks diffusion of fluorine atoms therethrough.

A plurality of electrically conductive layers 46 may be formed in the plurality of backside recesses 43, and a continuous metallic material layer 46L may be formed on the sidewalls of each backside trench 79 and over the contact-level dielectric layer 73. Each electrically conductive layer 46 includes a portion of the metallic barrier layer and a portion of the metallic fill material layer that are located between a vertically neighboring pair of dielectric material layers, which may be a pair of insulating layers 32, or a topmost insulating layer 32 and the insulating cap layer 70. The continuous metallic material layer 46L includes a continuous portion of the metallic barrier layer and a continuous portion of the metallic fill material layer that are located in the backside trenches 79 or above the contact-level dielectric layer 73.

Each sacrificial material layer 42 may be replaced with an electrically conductive layer 46. A backside cavity 79' is present in the portion of each backside trench 79 that is not filled with the backside blocking dielectric layer and the continuous metallic material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 9:
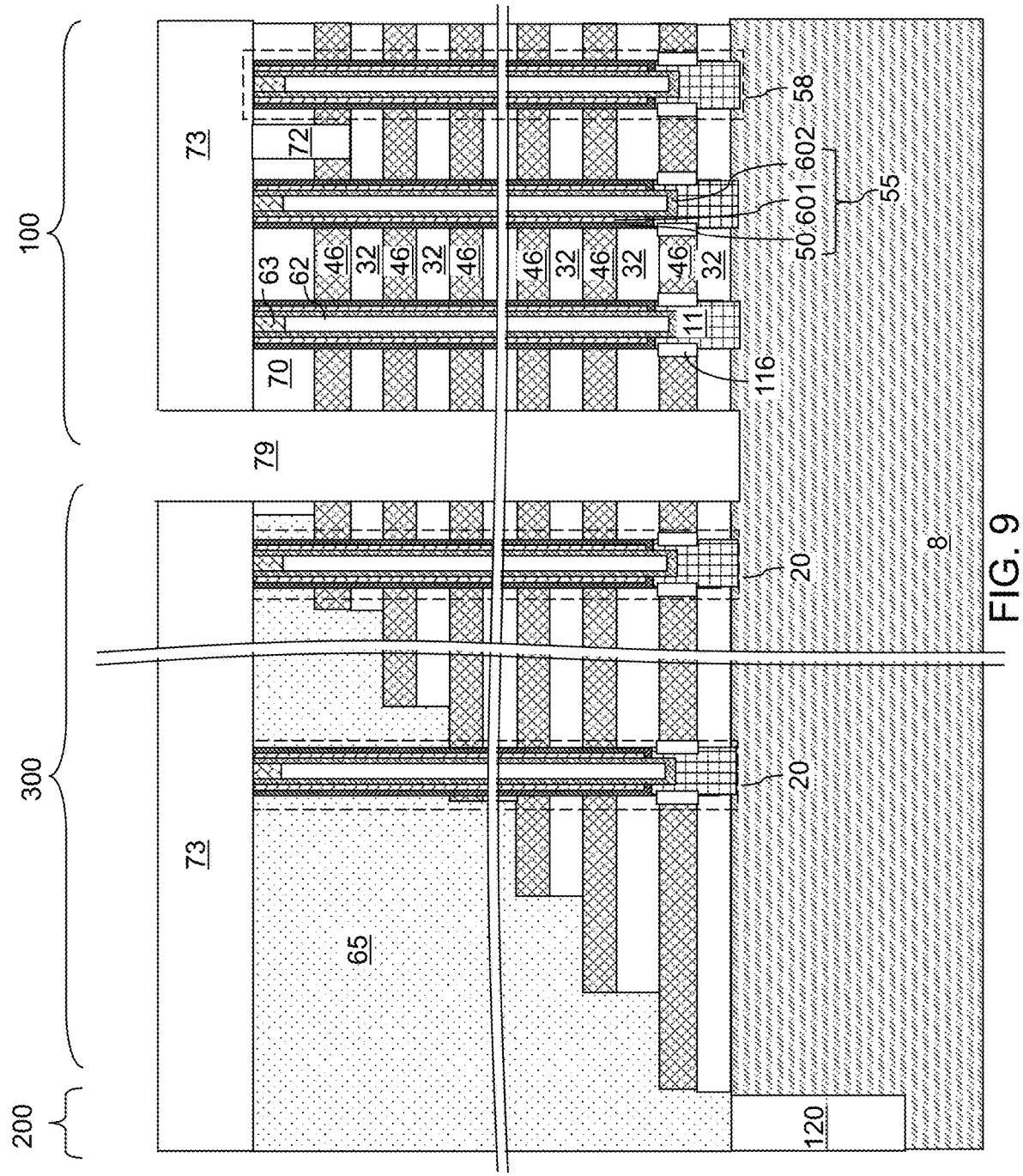
FIG. 9 is a schematic vertical cross-sectional view of the exemplary structure after removal of a deposited conductive material from within the backside trench according to an embodiment of the present disclosure.

Referring to FIG. 9, the deposited metallic material of the continuous electrically conductive material layer 46L is etched back from the sidewalls of each backside trench 79 and from above the contact-level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 may be a conductive line structure. Thus, the sacrificial material layers 42 are replaced with the electrically conductive layers 46.

Each electrically conductive layer 46 may function as a combination of a plurality of control gate electrodes located at a same level and a word line electrically interconnecting, i.e., electrically shorting, the plurality of control gate electrodes located at the same level. The plurality of control gate electrodes within each electrically conductive layer 46 are the control gate electrodes for the vertical memory devices including the memory stack structures 55. In other words, each electrically conductive layer 46 may be a word line that functions as a common control gate electrode for the plurality of vertical memory devices.

Generally, an in-process alternating stack of the insulating layers 32 and sacrificial material layers 42 may be formed over the front side surface of the semiconductor substrate 8. Memory opening fill structures 58 including a respective memory stack structure 55 may be formed through the in-process alternating stack (32, 42). An alternating stack of the insulating layers 32 and electrically conductive layers 46 may be formed by is formed by replacing the sacrificial material layers 42 with the electrically conductive layers 46.

Figure 10A:
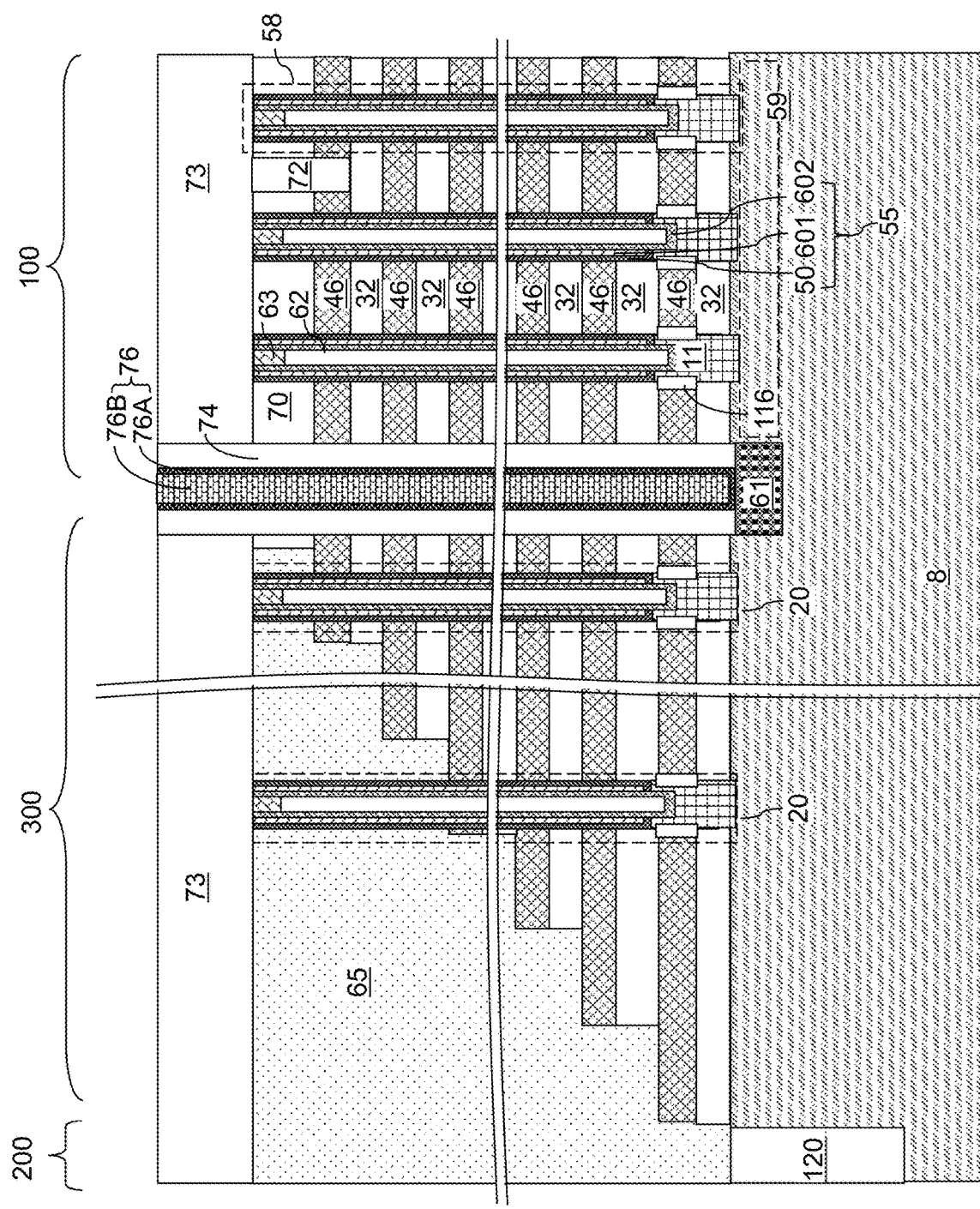
FIG. 10A is a schematic vertical cross-sectional view of the exemplary structure after formation of an insulating spacer and a backside contact structure according to an embodiment of the present disclosure.
Figure 10B:
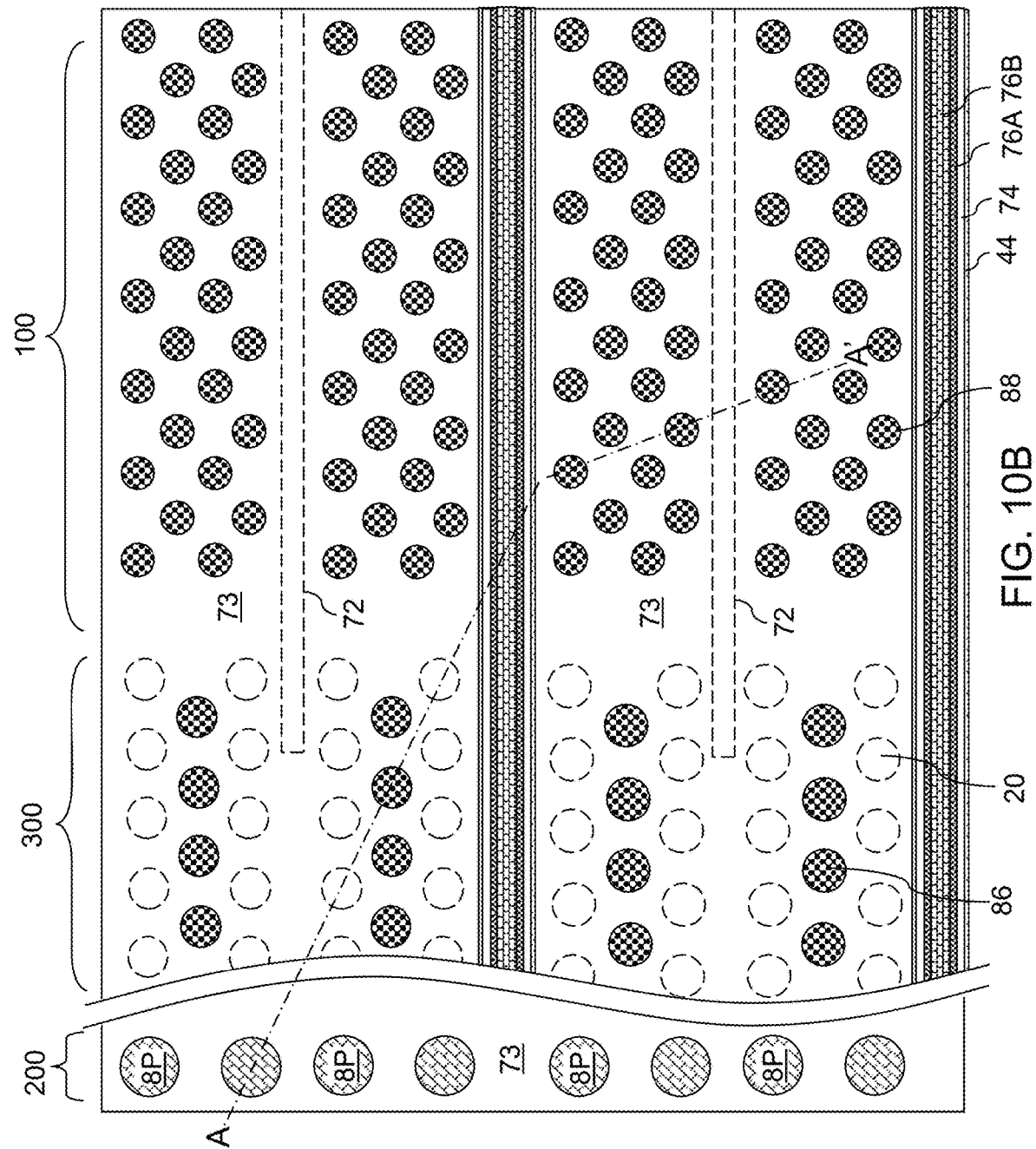
FIG. 10B is a top-down view of the exemplary structure of FIG. 10A. The vertical plane A-A' is the plane of the schematic vertical cross-sectional view of FIG. 10A.

Referring to FIG. 10, an insulating material layer may be formed in the at least one backside trench 79 and over the contact-level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer may include silicon oxide. The insulating material layer may be formed, for example, by low pressure chemical vapor deposition (LPCVD) or atomic layer deposition (ALD). The thickness of the insulating material layer may be in a range from 1.5 nm to 60 nm, although lesser and greater thicknesses may also be employed.

If a backside blocking dielectric layer is present, the insulating material layer may be formed directly on surfaces of the backside blocking dielectric layer and directly on the sidewalls of the electrically conductive layers 46. If a backside blocking dielectric layer is not employed, the insulating material layer may be formed directly on sidewalls of the insulating layers 32 and directly on sidewalls of the electrically conductive layers 46.

An anisotropic etch is performed to remove horizontal portions of the insulating material layer from above the contact-level dielectric layer 73 and at the bottom of each backside trench 79. Each remaining portion of the insulating material layer constitutes an insulating spacer 74. A backside cavity is present within a volume surrounded by each insulating spacer 74.

The anisotropic etch process may continue with, or without, a change in the etch chemistry to remove portions of the optional backside blocking dielectric layer and the planar dielectric portion 616 that underlies the opening through the insulating spacer 74. An opening is formed though the planar dielectric portion 616 underneath each backside cavity, thereby vertically extending the backside cavity. A top surface of the semiconductor substrate 8 may be physically exposed at the bottom of each backside trench 79.

A source region 61 may be formed at a surface portion of the semiconductor substrate 8 under each backside cavity by implantation of electrical dopants into physically exposed surface portions of the semiconductor substrate 8. Each source region 61 is formed in a surface portion of the semiconductor substrate 8 that underlies a respective opening through the insulating spacer 74. Due to the straggle of the implanted dopant atoms during the implantation process and lateral diffusion of the implanted dopant atoms during a subsequent activation anneal process, each source region 61 may have a lateral extent greater than the lateral extent of the opening through the insulating spacer 74.

An upper portion of the semiconductor substrate 8 that extends between the source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the source region 61 and the plurality of pedestal channel portions 11. A bottommost electrically conductive layer 46 provided upon formation of the electrically conductive layers 46 within the alternating stack (32, 46) may comprise a select gate electrode for the field effect transistors. Semiconductor channels (59, 11, 60) extend between each source region 61 and a respective set of drain regions 63. The semiconductor channels (59, 11, 60) include the vertical semiconductor channels 60 of the memory stack structures 55.

A backside contact via structure 76 may be formed within each backside cavity. Each contact via structure 76 may fill a respective cavity. The contact via structures 76 may be formed by depositing at least one conductive material in the remaining unfilled volume (i.e., the backside cavity) of the backside trench 79. For example, the at least one conductive material may include a conductive liner 76A and a conductive fill material portion 76B. The conductive liner 76A may include a conductive metallic liner such as TiN, TaN, WN, TiC, TaC, WC, an alloy thereof, or a stack thereof. The thickness of the conductive liner 76A may be in a range from 3 nm to 30 nm, although lesser and greater thicknesses may also be employed. The conductive fill material portion 76B may include a metal or a metallic alloy. For example, the conductive fill material portion 76B may include W, Cu, Al, Co, Ru, Ni, an alloy thereof, or a stack thereof.

The at least one conductive material may be planarized employing the contact-level dielectric layer 73 overlying the alternating stack (32, 46) as a stopping layer. If chemical mechanical planarization (CMP) process is employed, the contact-level dielectric layer 73 may be employed as a CMP stopping layer. Each remaining continuous portion of the at least one conductive material in the backside trenches 79 constitutes a backside contact via structure 76.

Each backside contact via structure 76 extends through the alternating stack (32, 46), and contacts a top surface of the source region 61. If a backside blocking dielectric layer is employed, the backside contact via structure 76 may contact a sidewall of the backside blocking dielectric layer.

Figure 11A:
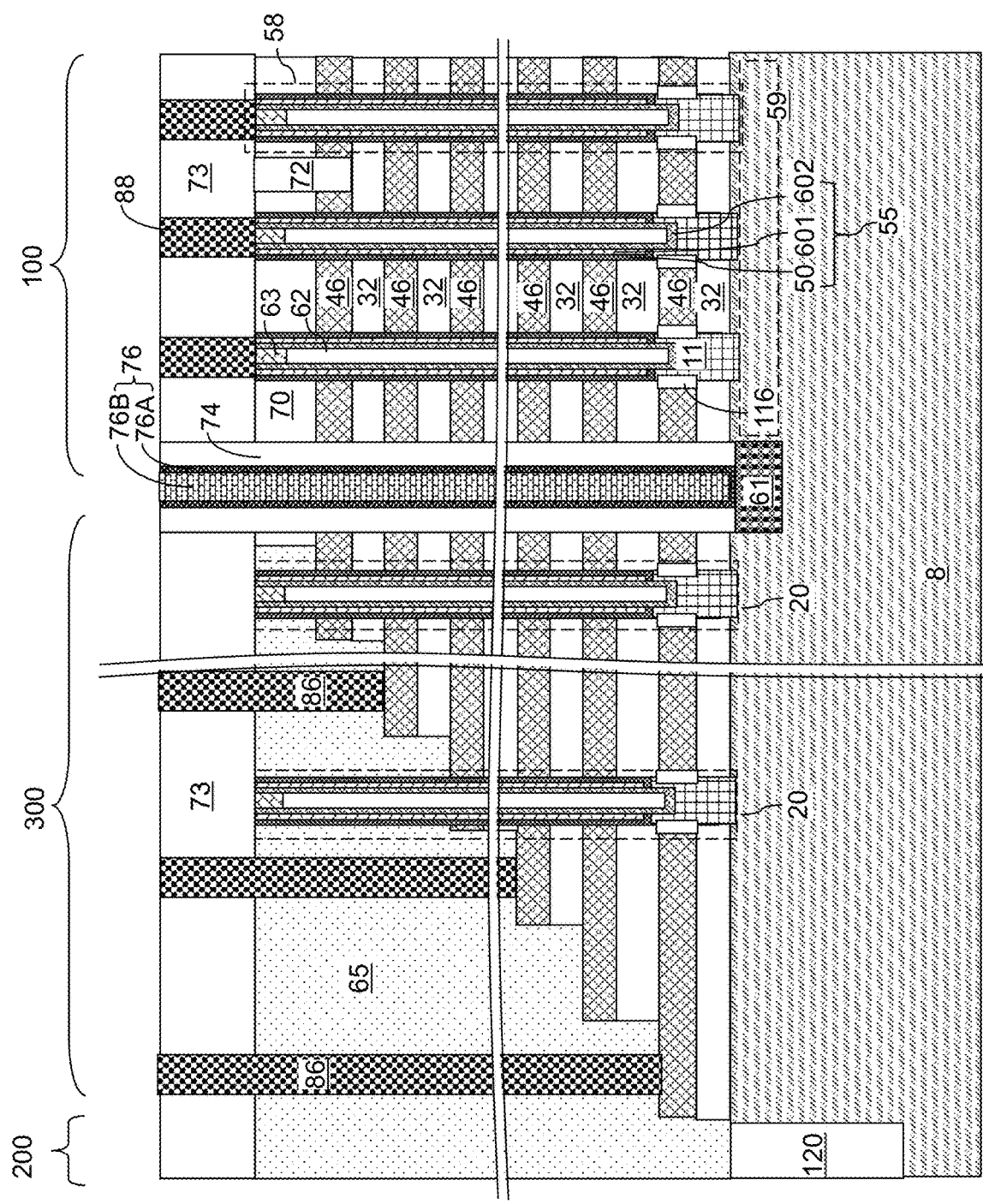
FIG. 11A is a schematic vertical cross-sectional view of the exemplary structure after formation of additional contact via structures according to an embodiment of the present disclosure.
Figure 11B:
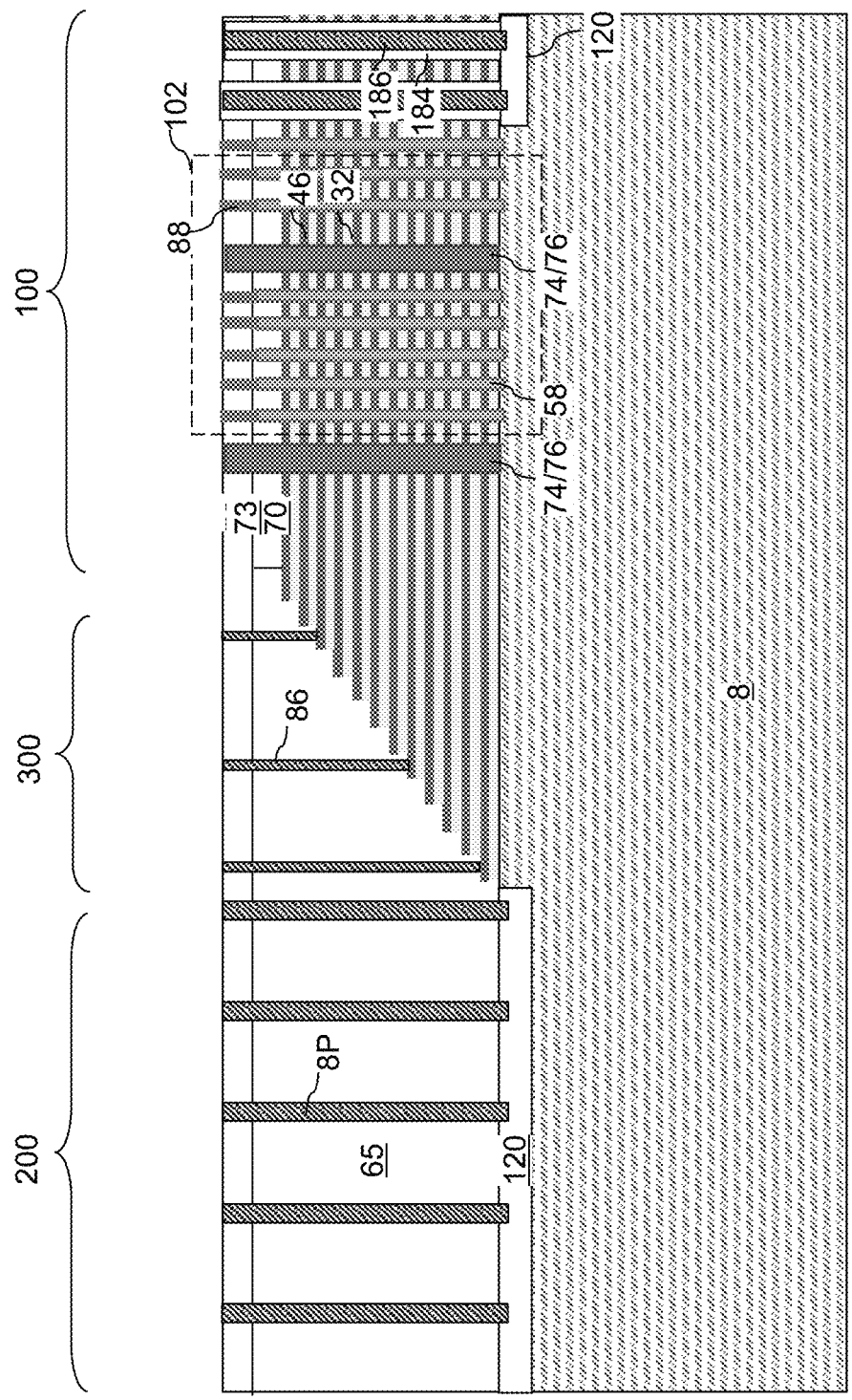
FIG. 11B is another schematic vertical cross-sectional view of the exemplary structure of FIG. 11A.

Referring to FIGS. 11A and 11B, additional contact via structures (88, 86, 8P, 186) may be formed through the contact-level dielectric layer 73, and optionally through the stepped dielectric material portion 65. For example, drain contact via structures 88 may be formed through the contact-level dielectric layer 73 on each drain region 63. Word line contact via structures 86 may be formed on the electrically conductive layers 46 through the contact-level dielectric layer 73, and through the stepped dielectric material portion 65. A three-dimensional memory device 102 may include the memory stack structures 55 (e.g., memory film 50 and vertical semiconductor channel 60) that are part of the respective memory opening fill structure 58, the electrically conductive layers 46 that include select gate electrodes and word lines for the memory stack structures 55, the bit lines 98 that are electrically connected to a respective set of drain regions 63, and/or the backside bias lines 664 (which may be source bias lines).

The contact via structures (88, 86, 8P, 186) may include through-memory-level via structures (8P, 186P). For example, the through-memory-level via structures (8P, 186) may include array-region through-memory-level via structures 186 that are formed in the memory array region 186 and peripheral-region through-memory-level via structures 8P that are formed in the peripheral region 200.

For example, as shown in FIG. 11B, array-region through-memory-level via cavities may be formed through the alternating stack of the insulating layers 32 and the electrically conductive layers 46 down to a top surface of the semiconductor substrate 8, such as the top surface of a respective memory-side shallow trench isolation structure 120 in the memory array region 100. A dielectric material layer such as silicon oxide may be conformally deposited in the array-region through-memory-level via cavities, and may be subsequently anisotropically etched to form a tubular insulating spacer in each array-region through-memory-level via cavity. Each tubular insulating spacer is herein referred to as a through-memory-level dielectric spacer 184. The array-region through-memory-level via structures 186 may be formed within a remaining unfilled volume of a respective array-region through-memory-level via cavity inside, and directly on, a respective through-memory-level dielectric spacer 184. Each array-region through-memory-level via structure 186 may be formed through the alternating stack of the insulating layers 32 and the electrically conductive layers 46 in the memory array region 100.

Peripheral-region through-memory-level via cavities may be formed through the contact-level dielectric layer 73 and the stepped dielectric material portion 65 down to a top surface of a respective memory-side shallow trench isolation structure 120 in the peripheral region 200. The peripheral-region through-memory-level via structures 8P may be formed within a respective peripheral-region through-memory-level via cavity. Each peripheral-region through-memory-level via structure 8P may be formed through the stepped dielectric material portion 65 in the peripheral region 200.

In one embodiment, both the peripheral-region through-memory-level via structures 8P and the array-region through-memory-level via structures 186 may be formed. In another embodiment, only peripheral-region through-memory-level via structures 8P or only array-region through-memory-level via structures 186 may be formed. While the present disclosure is described employing an embodiment in which the peripheral-region through-memory-level via structures 8P and the array-region through-memory-level via structures 186 are formed after formation of the alternating stack of insulating layers 32 and electrically conductive layers 46, embodiments are expressly contemplated herein in which the peripheral-region through-memory-level via structures 8P and/or the array-region through-memory-level via structures 186 are formed prior to replacement of the sacrificial material layers 42 with the electrically conductive layers 46. For example, the through-memory-level dielectric spacers 184 and the array-region through-memory-level via structures 186 may be formed through the in-process alternating stack of the insulating layers 32 and the sacrificial material layers 42 prior to replacement of the sacrificial material layers 42 with the electrically conductive layers 46.

Generally, the through-memory-level via structures (186, 8P) vertically extend at least from a first horizontal plane including a surface of the alternating stack (32, 46) (such as the topmost surface of the topmost electrically conductive layer 46) that is most distal from the semiconductor substrate 8 and at least to a second horizontal plane including a surface of the alternating stack (32, 46) that is most proximal to the semiconductor substrate 8 (such as the bottom surface of the bottommost insulating layer 32 of the alternating stack (32, 46)). In one embodiment, the alternating stack (32, 46) may contacts the front side surface of the semiconductor substrate 8, and the through-memory-level via structures (186, 8P) may vertically extend through the second horizontal plane.

The assembly of all structures located between the second horizontal plane and the horizontal plane including the top surfaces of the through-memory-level via structures (186, 8P) is herein referred to as a memory-level structure. The memory-level structure may have a thickness in a range from 5 microns to 100 microns. However, lesser and greater thicknesses may also be used. The memory-level structure includes a three-dimensional array of memory elements, and is formed on the front side surface of the semiconductor substrate 8. The through-memory-level via structures (186, 8P) are formed through the memory-level structure.

According to an embodiment of the present disclosure, the contact via structures (88, 86, 8P, 186) may be entirely made of at least one conductive material that is resistant to high temperature anneal, which is subsequently performed to activate dopants in semiconductor devices, such as CMOS devices to be formed on the backside of the semiconductor substrate 8 in subsequent processing steps. In one embodiment, the contact via structures (88, 86, 8P, 186) may be entirely made of a metallic liner material (such as TiN, TaN, or WN), a heavily-doped semiconductor material such as doped polysilicon, and/or a metallic material that is resistant to high temperature anneal such as tungsten.

Figure 12:
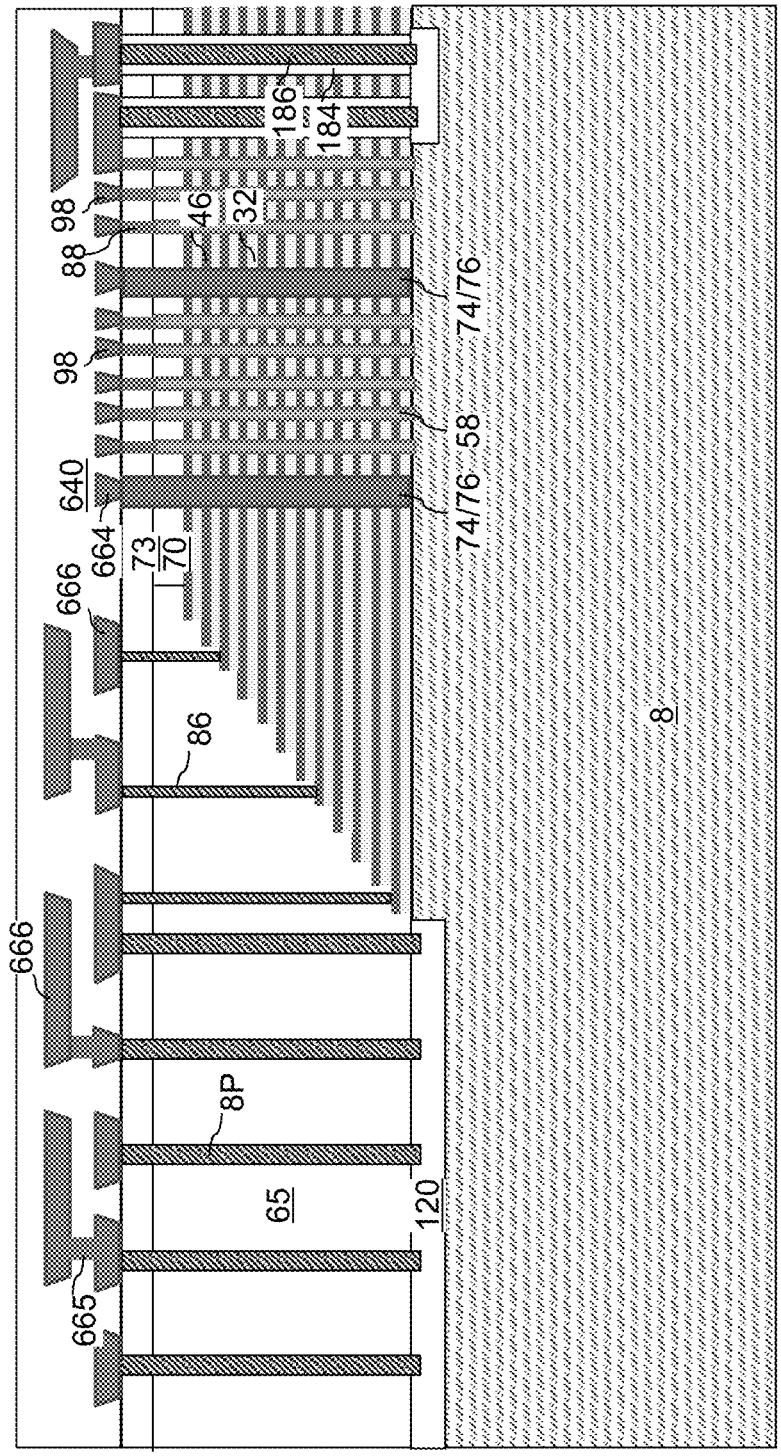
FIG. 12 is a schematic vertical cross-sectional view of the exemplary structure after formation of memory-side dielectric material layers embedding memory-side metal interconnect structures according to the first embodiment of the present disclosure.

Referring to FIG. 12, memory-side dielectric material layers 640 and memory-side metal interconnect structures (664, 666, 98, 665) may be subsequently formed over the alternating stack of the insulating layers 32 and the electrically conductive layers 46, the retro-stepped dielectric material portion 65, and the contact level dielectric layer 73. The memory-side dielectric material layers 640 may include, for example, via-level dielectric material layers, line-level dielectric material layers, a pad-level dielectric material layer, and optionally a passivation dielectric layer. Each of the memory-side dielectric material layers 640 includes a respective dielectric material such as silicon oxide, silicon nitride, silicon oxynitride, a dielectric metal oxide, organosilicate glass, or combinations thereof.

The memory-side metal interconnect structures (664, 666, 98, 665) may include backside bias lines 664 (which may be source bias lines) contacting the backside contact via structures 76, bit lines 98 contacting a respective subset of the drain contact via structures 88, and memory-side metal line structures 666, which may be metal line structures. A first subset of the memory-side metal line structures 666 may directly contact a top surface of a respective one of the array-region through-memory-level via structures 186 in the memory array region 100. A second subset of the memory-side metal line structures 666 may directly contact a top surface of a respective one of the peripheral-region through-memory-level via structures 8P. A third subset of the memory-side metal line structures 666 may contact a top surface of a respective one of the word line contact via structures 86. In one embodiment, one or more of the electrically conductive layers 46 may be electrically connected to a respective one of the peripheral-region through-memory-level via structures 8P through the word line contact via structures 86 and the memory-side metal line structures 666.

The memory-side metal interconnect structures (664, 666, 98, 665) may further include memory-side metal via structures 665 that contact a respective one of the memory-side metal line structures 666 and provide vertical electrical connections within the memory-side dielectric material layers 640. In one embodiment, the top surfaces of the memory-side metal interconnect structures (664, 666, 98, 665) may be covered with a topmost dielectric layer of the memory-side dielectric material layers 640.

According to an embodiment of the present disclosure, the memory-side metal interconnect structures (664, 666, 98, 665) may be entirely made of at least one conductive material that is resistant to high temperature anneal, which is subsequently performed to activate dopants in in semiconductor devices 700, such as CMOS devices to be formed on the backside of the semiconductor substrate 8 in subsequent processing steps. In one embodiment, the memory-side metal interconnect structures (664, 666, 98, 665) may be entirely made of a metallic liner material (such as TiN, TaN, or WN) and a metallic material that is resistant to high temperature anneal such as tungsten. In one embodiment, each of the memory-side metal interconnect structures (664, 666, 98, 665) may consist of a metallic liner including a conductive metallic nitride material and a conductive fill material portion including tungsten.

Figure 13:
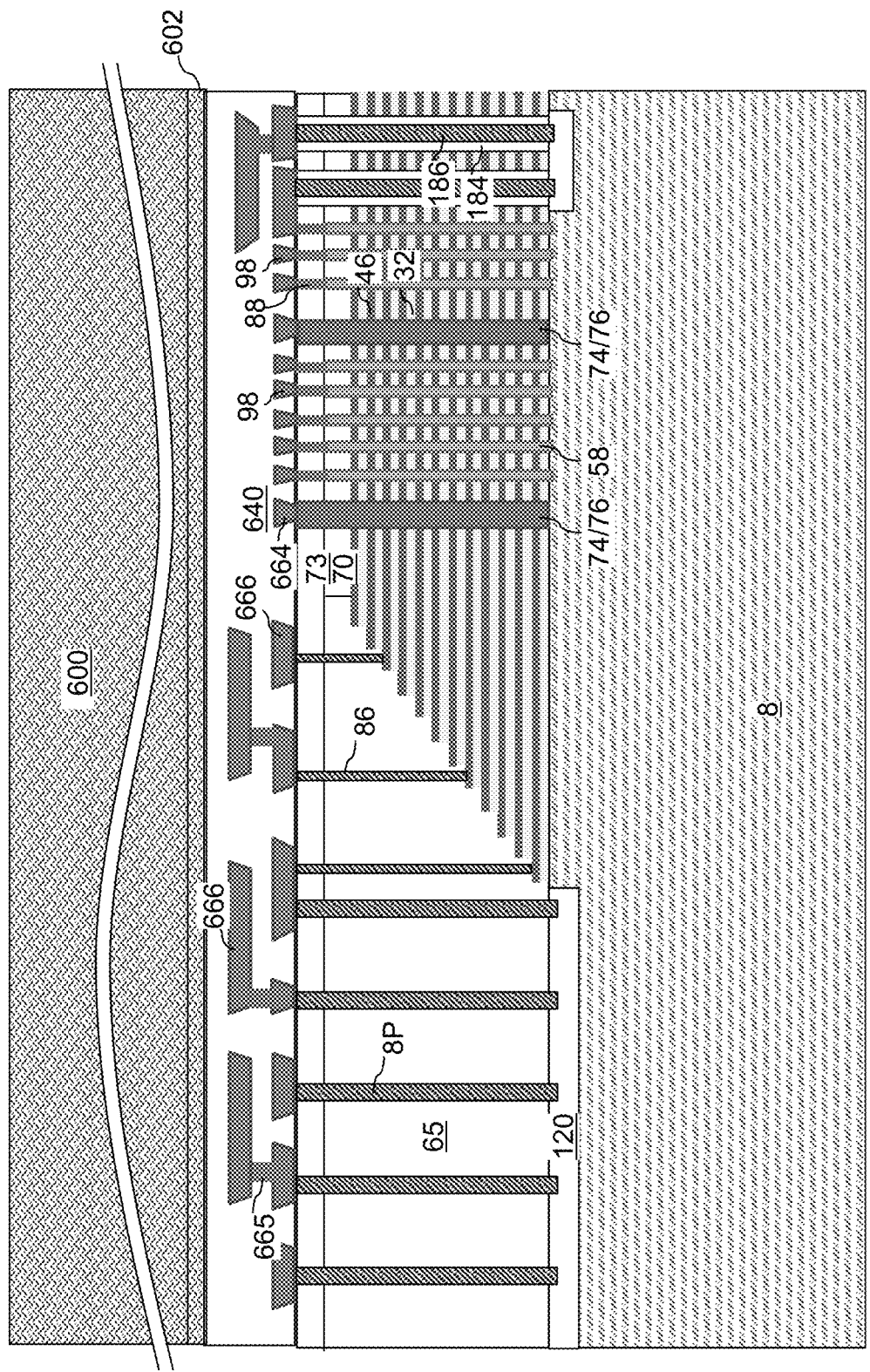
FIG. 13 is a schematic vertical cross-sectional view of the exemplary structure after bonding a handle substrate to the memory-side dielectric material layers according to the first embodiment of the present disclosure.

Referring to FIG. 13, a handle substrate 600 may be attached to the physically exposed horizontal surface of the topmost dielectric layer of the memory-side dielectric material layers 640, which may be a silicon oxide layer. The handle substrate 600 may include a semiconductor material, an insulating material, or a conductive material. The thickness of the handle substrate 600 is selected such that the handle substrate 600 may provide mechanical support to the memory-level structure during a subsequent processing step in which the semiconductor substrate 8 is thinned.

The handle substrate 600 may be composed of a material that is capable of bonding with the material of the topmost dielectric layer of the memory-side dielectric material layers 640, or may have a surface coating including a material that is capable of bonding with the material of the topmost dielectric layer of the memory-side dielectric material layers 640. In one embodiment, the entirety of a physically exposed surface of the handle substrate 600 that faces, and is subsequently bonded to, the memory-side dielectric material layers 640 may have a first homogenous material composition throughout, and the entirety of a physically exposed surface of the memory-side dielectric material layers 640 that faces, and is subsequently bonded to, the handle substrate 600 may have a second homogeneous material composition throughout.

In one embodiment, the first homogenous material composition may be a dielectric material (such as silicon oxide, including thermal silicon oxide or TEOS oxide, i.e., a silicon oxide material formed by decomposition of tetraethylorthosilicate (TEOS) and including carbon and hydrogen as residual components). Alternatively, the first homogeneous material composition may be a semiconductor material (such as silicon or silicon-germanium). In one embodiment, the first homogeneous material composition may be different from the second homogeneous material composition. For example, the first homogeneous material composition may include a first silicon oxide material, and the second homogeneous material composition may include a second silicon oxide material including a dopant or an impurity atom at an atomic concentration that is different from the atomic concentration of the dopant or the impurity atom within the first silicon oxide material.

In one embodiment, the first homogeneous material composition may be selected from, but is not limited to, silicon oxide, such as a doped silicate glass, a porous silicate glass, or thermal silicon oxide, or a semiconductor material such as doped or undoped silicon, or an organic adhesive material. In an illustrative example, the topmost dielectric layer of the memory-side dielectric material layers 640 may include silicon oxide, and the planar surface of the handle substrate 600 that faces the topmost dielectric layer of the memory-side dielectric material layers 640 for bonding may include a semiconductor surface (such as a silicon surface or a silicon oxide surface. In a non-limiting illustrative example, the handle substrate 600 may include a commercially available silicon wafer having a thickness of about 1 mm, and the handle substrate 600 may be bonded to a topmost dielectric layer of the memory-side dielectric material layers 640 via silicon to silicon oxide bonding or silicon oxide to silicon oxide bonding. If the silicon substrate is directly bonded to the silicon oxide material of the topmost dielectric layer of the memory-side dielectric material layers 640, silicon to silicon oxide bonding may be employed. If an optional silicon oxide bonding layer 602 is formed on a surface of the silicon wafer 600 that faces the topmost dielectric layer of the memory-side dielectric material layers 640, silicon oxide to silicon oxide bonding (e.g., relatively low temperature oxide bonding) may be employed. Generally, the top surfaces of the memory-side metal interconnect structures (664, 666, 98, 665) may be covered with a topmost dielectric layer of the memory-side dielectric material layers 640 so that the memory-side metal interconnect structures (664, 666, 98, 665) are protected when a topmost surface of the memory-side dielectric material layers 640 is temporarily bonded to a handle substrate 600.

Figure 14:
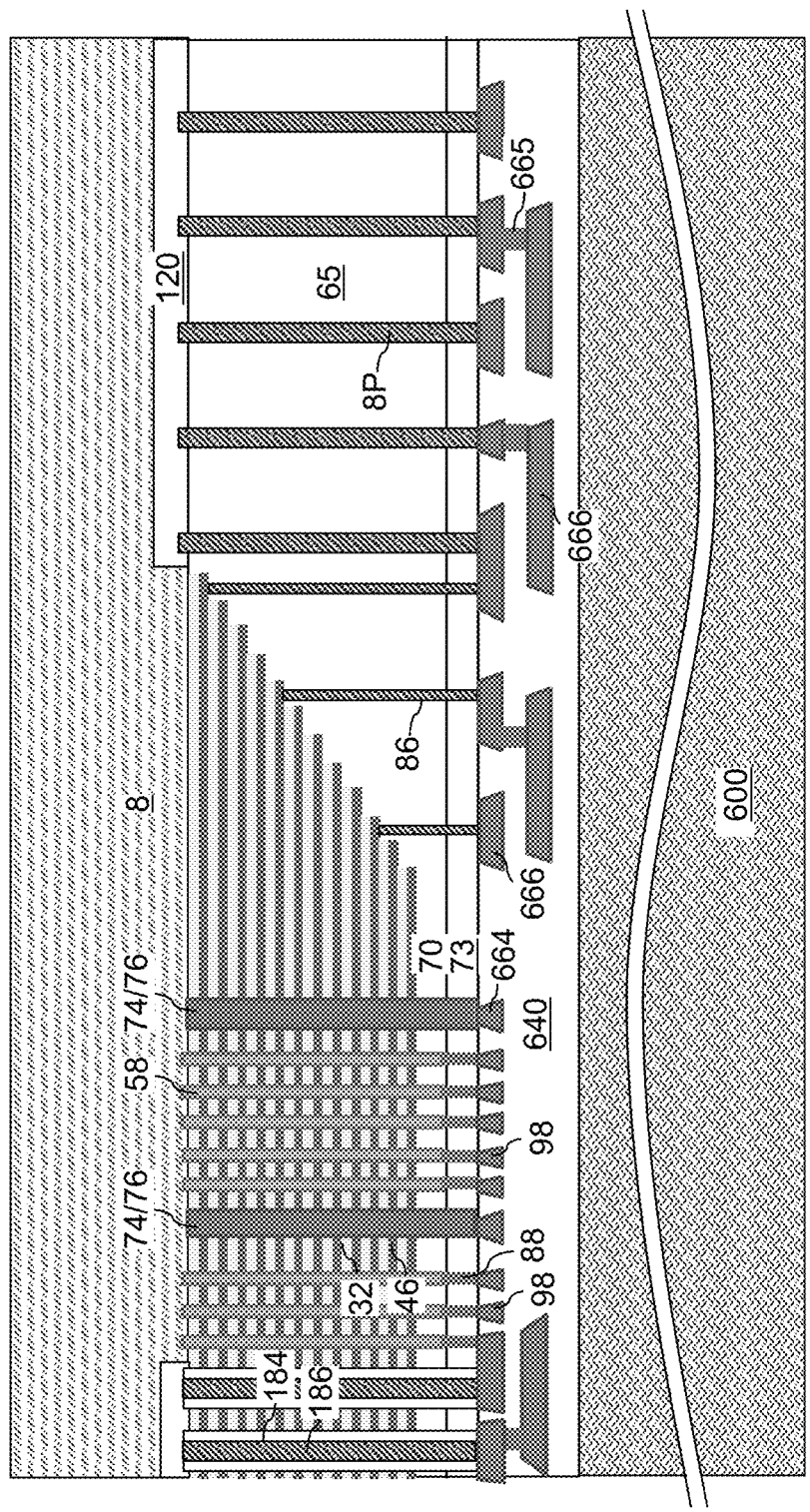
FIG. 14 is a schematic vertical cross-sectional view of the exemplary structure after thinning a semiconductor substrate according to the first embodiment of the present disclosure.

Referring to FIG. 14, the semiconductor substrate 8 may be thinned from the backside to a target thickness, which may be in a range from 1 micron to 10 microns. However, lesser or greater thicknesses may also be used. The thinning of the semiconductor substrate 8 may be effected by grinding, polishing, an isotropic etch process, and/or an anisotropic etch process that removes the material of the semiconductor substrate 8 from the backside. For example, the semiconductor substrate 8 may be thinned by a combination of grinding and polishing that employs a touch-up chemical mechanical planarization process. The semiconductor substrate 8 is thinned while the handle substrate 600 is attached to the memory-side dielectric material layers 640. The handle substrate 600 may provide mechanical support to the memory-level structure and the semiconductor substrate 8 during handling of the semiconductor substrate 8 through the thinning process. The exemplary structure may be flipped upside down so that additional processing steps may be performed on the backside surface of the semiconductor substrate 8 after thinning of the semiconductor substrate 8.

Figure 15:
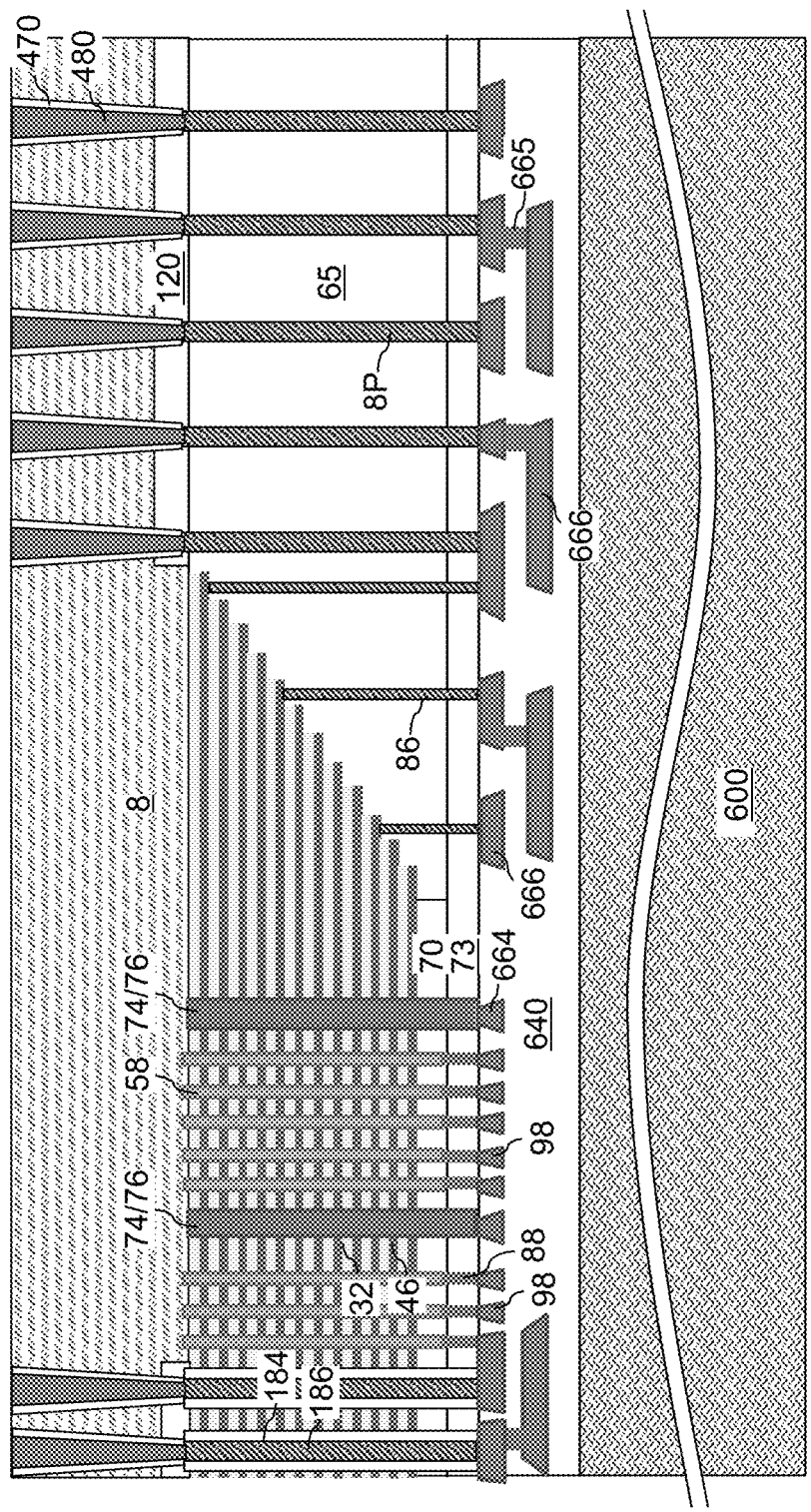
FIG. 15 is a schematic vertical cross-sectional view of the exemplary structure after formation of laterally-insulated through-substrate via structures according to the first embodiment of the present disclosure.

Referring to FIG. 15, a photoresist layer (not shown) may be applied over the backside surface of the thinned semiconductor substrate 8, and is lithographically patterned to form openings in areas that overlie the through-memory-level via structures (186, 8P). An anisotropic etch process may be performed to etch through portions of the semiconductor substrate 8 and the memory-side shallow trench isolation structures 120 that underlie the openings through the photoresist layer. The through-memory-level via structures (186, 8P) may be employed as an etch stop structure for the anisotropic etch process. Through-substrate via cavities are formed by anisotropically etching unmasked portions of the thinned semiconductor substrate 8 and the memory-side shallow trench isolation structures 120 from the backside semiconductor surface toward the front-side surface of the semiconductor substrate 8 while the handle substrate 600 is attached. A proximal surface of a respective one of the through-memory-level via structures (186, 8P) is physically exposed at a deep end (i.e., bottom) of each of the through-substrate via cavities. In one embodiment, the sidewalls of the through-substrate via cavities may be tapered such that each through-substrate via cavity has a greater lateral dimension within the plane of the physically exposed backside surface of the thinned semiconductor substrate 8 than at a bottom surface at which a proximal surface of a through-memory-level via structure (186, 8P) is physically exposed. The taper angle of the sidewalls of the through-substrate via cavities may be in a range from 0.1 degree to 5 degrees, such as from 0.5 degrees to 2 degrees. Each of the through-substrate via cavities may have a lateral dimension (such as a diameter of a circular horizontal cross-sectional shape, a minor axis of an elliptical horizontal cross-sectional shape, or a width of a rectangular horizontal cross-sectional shape) within the physically exposed backside surface of the thinned semiconductor substrate 8 in a range from 300 nm to 6,000 nm, although lesser and greater lateral dimensions may also be employed.

A conformal dielectric material layer may be deposited on the sidewalls of the through-substrate via cavities. The conformal dielectric material layer may include silicon oxide or a layer stack of a thin silicon nitride liner and a silicon oxide layer. The thickness of the conformal dielectric material layer may be in a range from 50 nm to 300 nm, although lesser and greater thicknesses may also be employed. An anisotropic etch process may be performed to remove horizontal portions of the conformal dielectric material spacer. Each remaining tubular portion of the conformal dielectric material layer in a respective though-substrate via cavity constitutes a through-substrate dielectric spacer 470.

At least one conductive material may be deposited in unfilled remaining volumes of the through-substrate via cavities and directly on a respective proximal surface of the through-memory-level via structures (186, 8P). The at least one conductive material may include a layer stack of a conductive metallic nitride liner (such as a TiN liner, a TaN liner, or a WN liner), and a conductive fill material layer that is deposited on the conducive metallic nitride liner. The conductive fill material layer may include a heavily doped semiconductor material (such as doped polysilicon) or a metallic fill material (such as tungsten, aluminum, copper, molybdenum, another elemental metal, or an alloy or a layer stack thereof). Excess portions of the conductive fill material layer and the conductive metallic nitride liner may be removed from above the horizontal plane including the backside surface of the thinned semiconductor substrate 8 by a planarization process such as a recess etch or a chemical mechanical planarization process. Each remaining portion of the at least one conductive material filling a volume of a respective through-substrate via cavity constitutes through-substrate conductive via structure 480. Each contiguous combination of a through-substrate dielectric spacer 470 and a through-substrate conductive via structure 480 constitutes a laterally-insulated through-substrate via structure (470, 480) that provides a laterally insulated electrically conductive path that vertically extends through the thinned semiconductor substrate 8. Each laterally-insulated through-substrate via structure (470, 480) contact a respective one of the through-memory-level via structures (186, 8P) and vertically extend between the front side surface (which is also referred to as a proximal horizontal surface herebelow) and a physically exposed backside semiconductor surface (which is also referred to as a distal horizontal surface herebelow) of the thinned semiconductor substrate 8.

Figure 16:
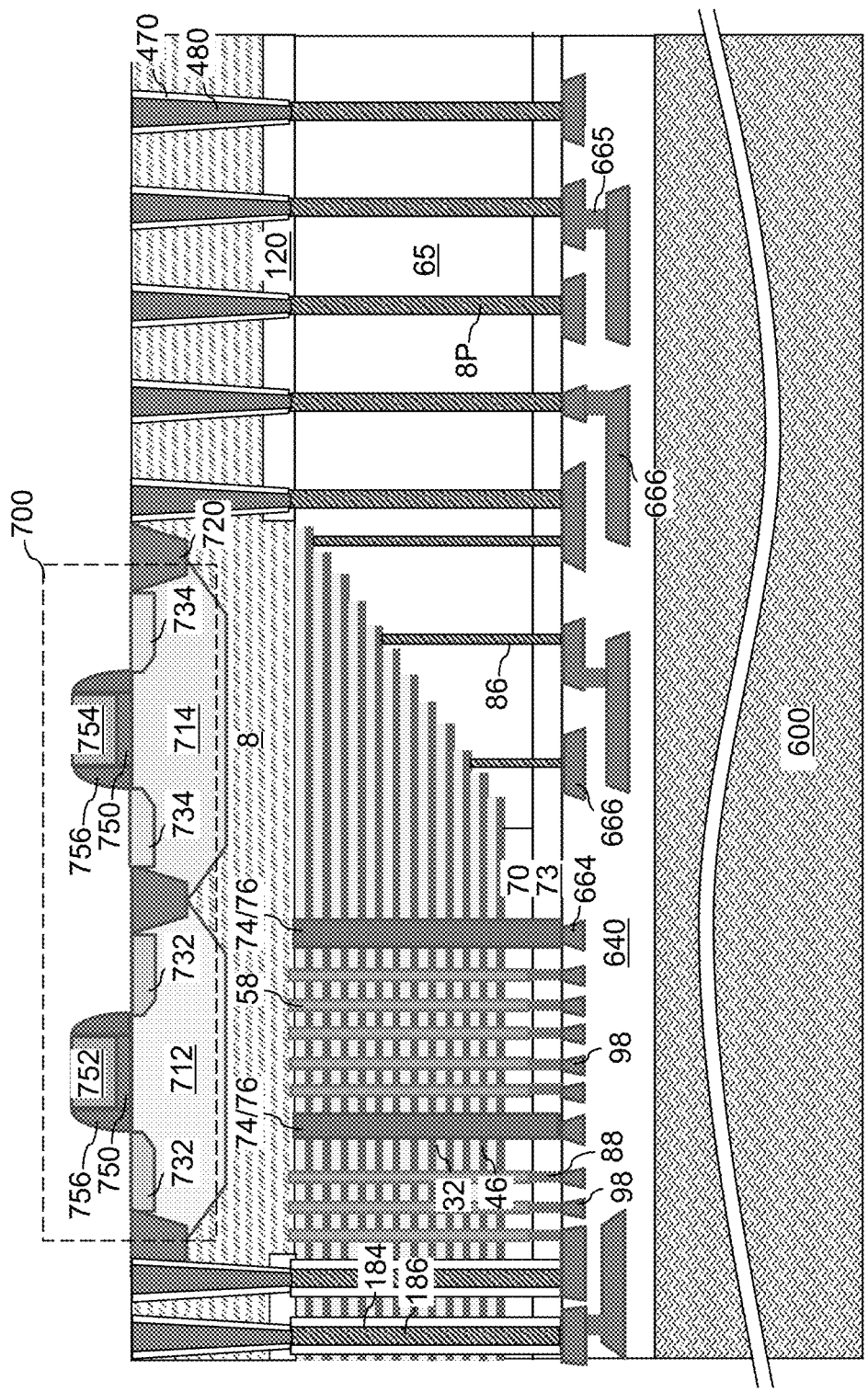
FIG. 16 is a schematic vertical cross-sectional view of the exemplary structure after formation of field effect transistors on the backside of the thinned semiconductor substrate according to the first embodiment of the present disclosure.

Referring to FIG. 16, various semiconductor devices 700, such field effect transistors in a complementary metal-oxide-semiconductor (CMOS) configuration (e.g., CMOS devices) may be formed on the backside of the semiconductor substrate 8. For example, photoresist layers (not shown) may be applied and ion implantation steps may be performed to form various doped semiconductor wells (712, 714), which may include p-doped semiconductor wells 712 and n-doped semiconductor wells 714. Surface portions of the semiconductor substrate 8 may be implanted with electrical dopants through the backside surface of the semiconductor substrate 8.

Logic-side shallow trench isolation structures 720 may be formed by forming shallow trenches by a combination of lithographic patterning and anisotropic etching of physically exposed surface portions underneath the backside surface of the semiconductor substrate 8. Gate dielectrics 750, gate electrodes (752, 754), and gate sidewall spacers 756 may be subsequently formed. The gate electrodes (752, 754) may include first gate electrodes 752 providing a first work function for n-type field effect transistors formed over a respective p-doped semiconductor well 712, and second gate electrodes 754 providing a second work function for p-type field effect transistors formed over a respective n-doped semiconductor well 714. N-doped active regions 732 (such as source regions and drain regions) may be formed for npn field effect transistors, and p-doped active regions 734 may be formed for pnp field effect transistors. Each of the field effect transistors may include a respective channel that is a surface portion of the respective well (712, 714) in the semiconductor substrate 8 and a respective gate electrode (752, 754) that is vertically spaced from the semiconductor substrate 8 by a respective gate dielectric 750. Additional semiconductor devices such as diodes, capacitors, resistors, and inductors may be formed on the backside surface of the semiconductor substrate 8. An activation anneal process that activates dopants in the field effect transistors may be subsequently performed at an elevated temperature higher than 800 degrees Celsius.

Figure 17:
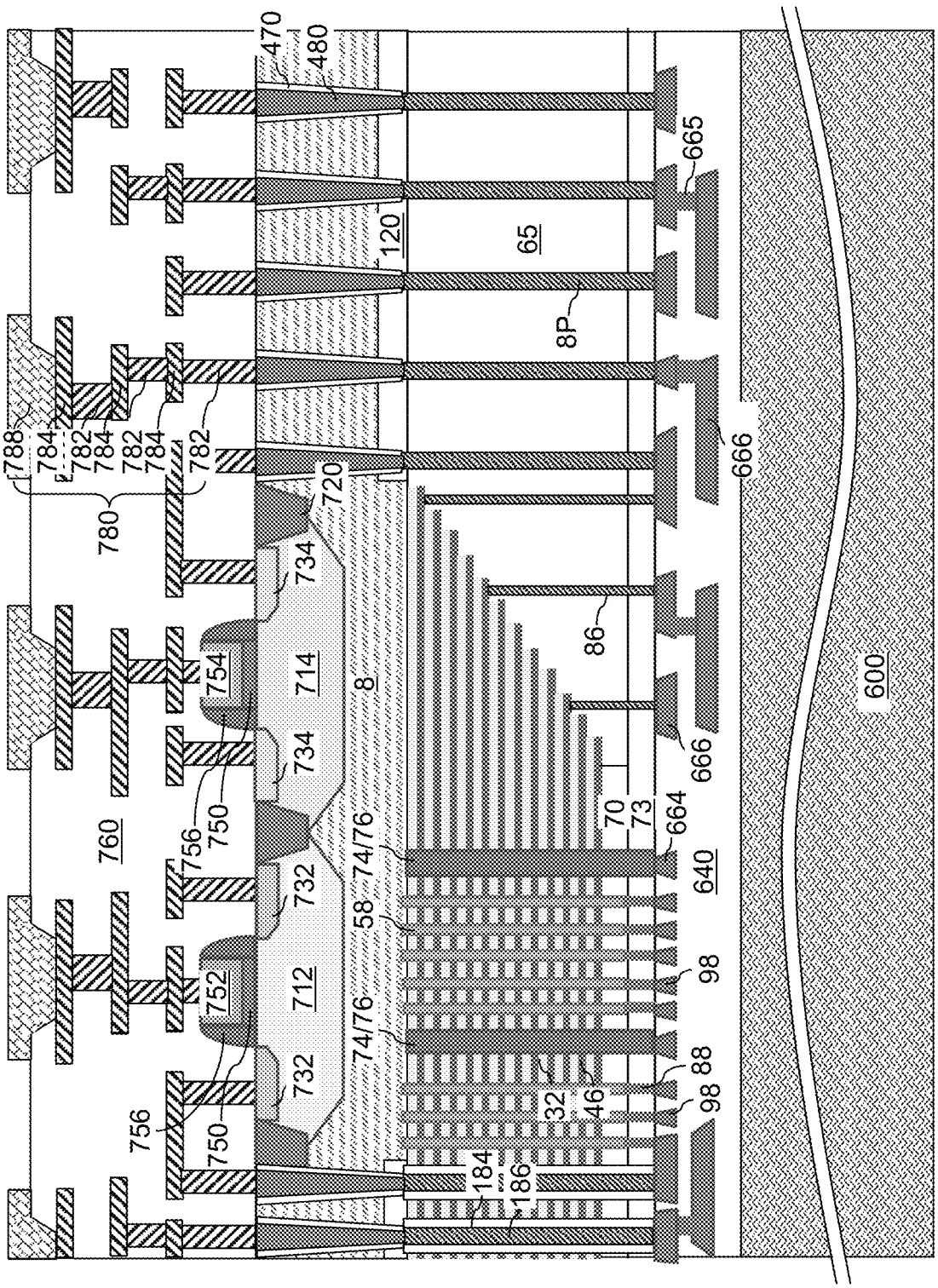
FIG. 17 is a schematic vertical cross-sectional view of the exemplary structure after formation of logic-side dielectric material layers embedding logic-side metal interconnect structures and formation of logic-side bonding pads according to the first embodiment of the present disclosure.

Referring to FIG. 17, logic-side dielectric material layers 760 may be formed over the backside surface of the semiconductor substrate 8 and the semiconductor devices thereupon. The logic-side dielectric material layers 760. The total thickness of the logic-side dielectric material layer 760 may be in a range from 1 micron to 5 microns, although lesser and greater thicknesses may also be used. Logic-side metal interconnect structures 780 may be embedded in the logic-side dielectric material layers 760. The logic-side metal interconnect structures 780 may include logic-side metal via structures 782, logic-side metal line structures 784, and optional logic-side bonding pads 788 if it is desired to bond leads or additional substrates to the backside of the semiconductor substrate 8. A subset of the logic-side metal via structures 782 may be formed directly on various nodes of the semiconductor devices 700 on the backside surface of the semiconductor substrate 8. The logic-side bonding pads 788 (if present) may be configured for solder bonding or for metal-to-metal bonding.

A subset of the logic-side metal via structures 782 may be formed directly on a respective one of the through-substrate via structures 480. In case the through-substrate via structures 480 are formed after thinning the semiconductor substrate 8, the through-substrate via structures 40 may be formed with a finite taper angle such that a top surface (i.e., a proximal surface) of each through-substrate via structures 480 has a greater surface area than a bottom surface (i.e., a distal surface) of each through-substrate via structures 480 that contacts a respective one of the through-memory-level via structures (486, 8P). In this case, each through-substrate via structure 480 may be formed with a first horizontal surface located within the proximal horizontal plane (i.e., the backside horizontal plane or a logic-side horizontal plane) having a greater area, and a second horizontal surface having a lesser area. In one embodiment, the semiconductor devices 700 that are formed on the backside surface of the thinned semiconductor substrate 8 may form driver circuit for the three-dimensional memory device 102. The driver circuit may include semiconductor devices 700 such as field effect transistors in a CMOS configuration.

Electrically conductive paths electrically connect nodes of the driver circuit to respective nodes of the three-dimensional memory device 102, such as the drain regions 63 in the memory opening fill structures 58, the electrically conductive layers 46, the bit lines 98, and/or the backside bias lines 664. In one embodiment, each of the electrically conductive paths may include one of the through-substrate via structures 480. In addition, at least a subset of the electrically conductive paths may comprise a respective subset of the logic-side metal interconnect structures 780 and a respective subset of the memory-side metal interconnect structures (664, 666, 665, 686).

For example, the bit lines 98 may be electrically connected to the semiconductor devices 700 (e.g., field effect transistors) through the laterally-insulated through-substrate via structures (470, 480), the through-memory-level via structures 186, and logic-side metal interconnect structures 780.

Figure 18:
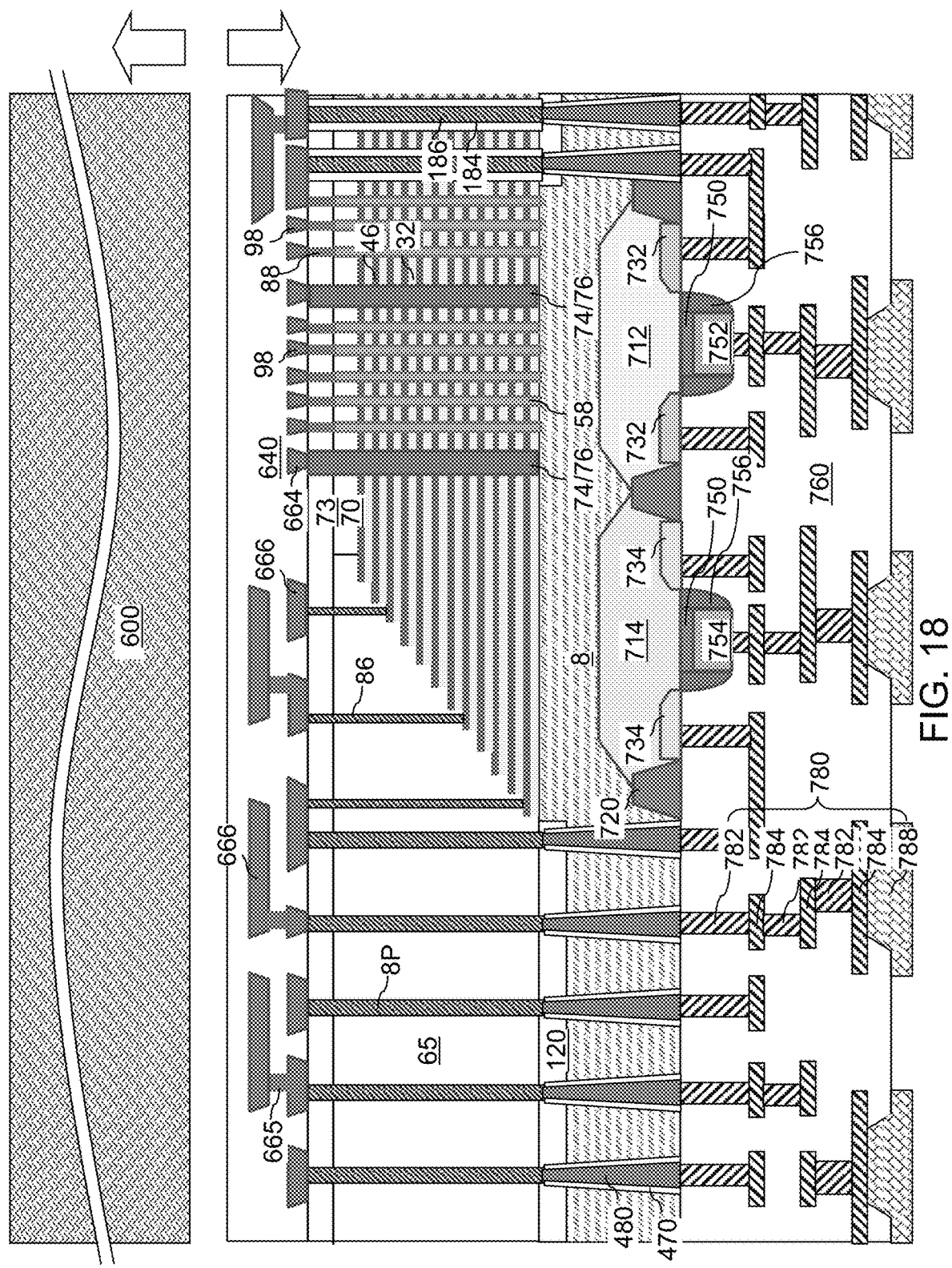
FIG. 18 is a schematic vertical cross-sectional view of the exemplary structure after removing the handle substrate according to the first embodiment of the present disclosure.

Referring to FIG. 18, the handle substrate 600 may be removed from the memory-side dielectric material layers 640, for example, by grinding, polishing and/or etching, such as isotropic or anisotropic etching. If grinding or polishing is employed, a horizontal surface of the memory-side dielectric material layers 640 that is bonded to the handle substrate 600 may be employed as a stopping surface. If an isotropic etch process or an anisotropic etch process is employed, the chemistry of the etch process may be selective to the material of an outermost layer of the memory-side dielectric material layers 640 that is bonded to the handle substrate 600. For example, if the handle substrate 600 includes a semiconductor material, such as silicon, the handle substrate 600 may be removed by grinding or polishing the semiconductor material employing an endpoint detector that detects physical expose of the silicon oxide material in the outermost layer of the memory-side dielectric material layers 640. Alternatively, the semiconductor material of the handle substrate 600 may be removed by an isotropic etch process employing a KOH solution, which etches the semiconductor material selective to silicon oxide. If the handle substrate 600 includes a different material, a suitable etch chemistry may be employed. In an alternative embodiment, if layer 602 comprises a release layer having a different composition from the memory-side dielectric material layers 640 and handle substrate 600, then layer 602 may be selectively removed by a selective etch to separate the handle substrate 600 from the memory-side dielectric material layers 640, which permits reuse for the handle substrate 600 during formation of the semiconductor devices 700 on additional semiconductor substrates 8. For example, if the release layer 602 is a silicon nitride layer, then a selective phosphoric acid etch may be used to remove the release layer 602 selective to a silicon handle substrate 600 and silicon oxide memory-side dielectric material layers 640.

Figure 19:
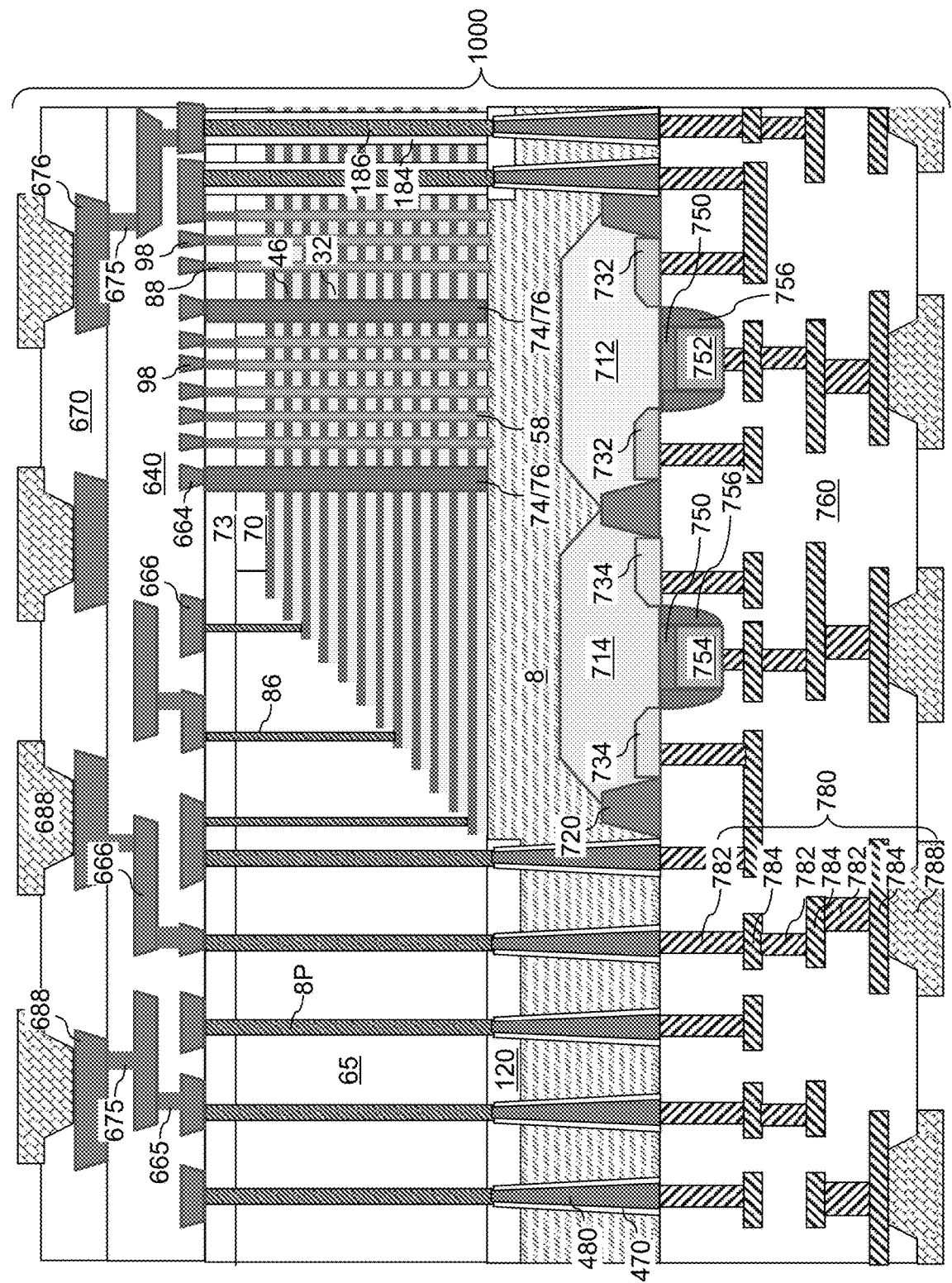
FIG. 19 is a schematic vertical cross-sectional view of the exemplary structure after formation of memory-side bonding pads according to the first embodiment of the present disclosure.

Referring to FIG. 19, optional additional memory-side dielectric material layers 670 and optional additional memory-side metal interconnect structures (675, 676, 688) may be formed on the memory-side dielectric material layers 640. In case the additional memory-side dielectric material layers 670 are formed, the memory-side dielectric material layers 640 are referred to proximal memory-side dielectric material layers 640 and the additional memory-side dielectric material layers 670 are referred to as distal memory-side dielectric material layers 670. The additional memory-side metal interconnect structures (675, 676, 688) are herein referred to as distal memory-side metal interconnect structures (675, 676, 688).

The distal memory-side metal interconnect structures (675, 676, 688) may include distal memory-side metal via structures 675, distal memory-side metal line structures 676, and optionally memory-side bonding pads 688 if it is desired to connect the distal memory-side metal line structures 676 to external electrical connections. The distal memory-side metal via structures 675 provide vertical electrically conductive paths, and the distal memory-side metal line structures 676 provide horizontal electrically conductive paths. The memory-side bonding pads 688 may be configured to provide solder bonding (such as C4 bonding) or may be configured to provide metal-to-metal bonding (such as copper-to-copper bonding).

Generally, the memory-side bonding pads 688 may be formed on a subset of the memory-side metal interconnect structures (98, 664, 666, 665, 675, 676) after removing the handle substrate 600. Optionally, additional bonding pads such as the logic-side bonding pads 788 may be formed on a subset of the logic-side metal interconnect structures 780 (such as on logic-side metal line structures 784) prior to, or after, removing the handle substrate 600. A first semiconductor die 1000 including a semiconductor substrate 8, a memory-level structure containing a three-dimensional memory device 102, memory-side dielectric material layers and memory-side metal interconnect structures, logic-side semiconductor devices including field effect transistors, and logic-side dielectric material layers and logic-side metal interconnect structures may be provided.

Figure 20:
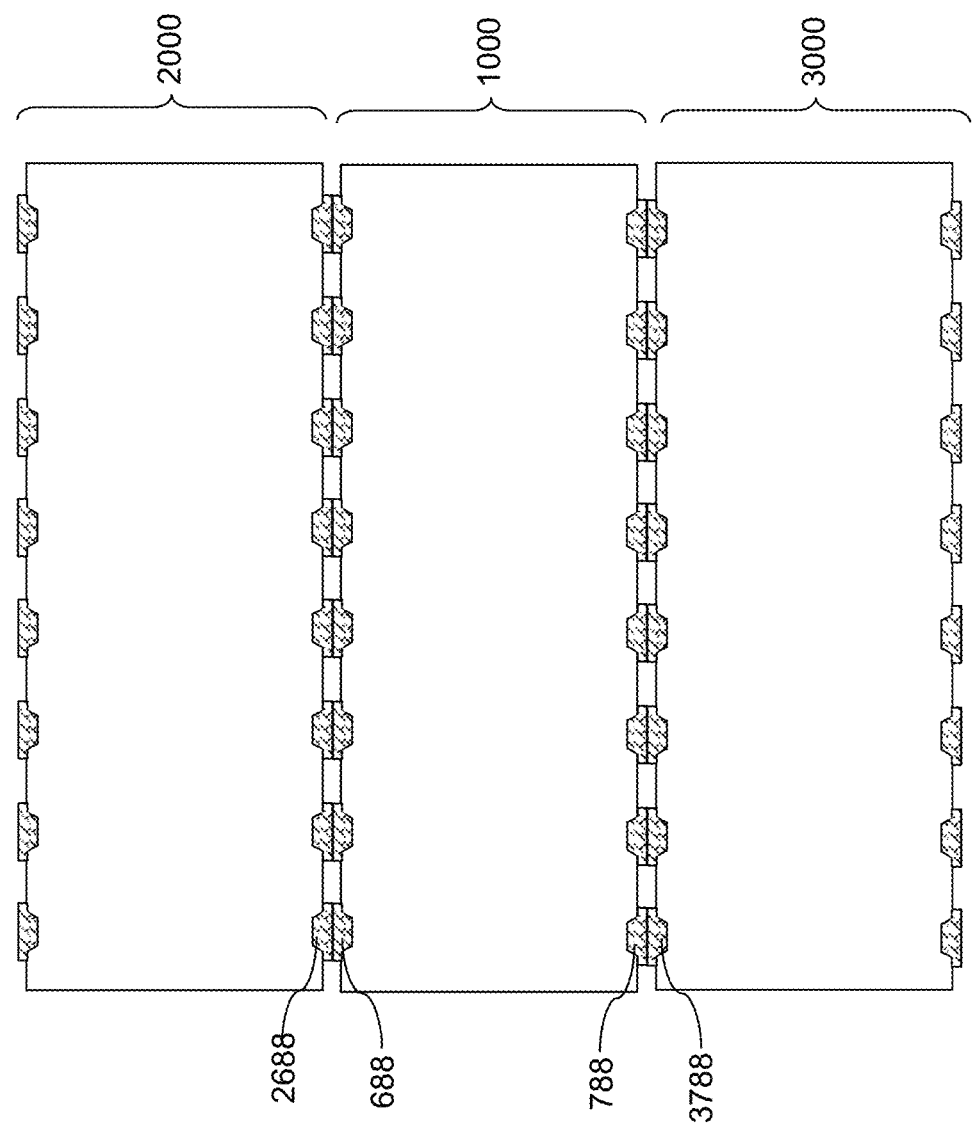
FIG. 20 is a schematic vertical cross-sectional view of the exemplary structure after bonding the semiconductor die of FIG. 19 to two additional semiconductor dies according to various embodiments of the present disclosure.

Referring to FIG. 20, the exemplary structure is illustrated after optionally bonding the semiconductor die 1000 of FIG. 19 to two optional additional semiconductor dies (2000, 3000). The two additional semiconductor dies (2000, 3000) may include a second semiconductor die 2000 including bonding pads 2688 that are bonded to the memory-side bonding pads 688 and a third semiconductor die 3000 including bonding pads 3788 that are bonded to the logic-side bonding pads 788. The optional second and third semiconductor die (2000, 3000) may be either logic and/or memory die.

Figure 21:
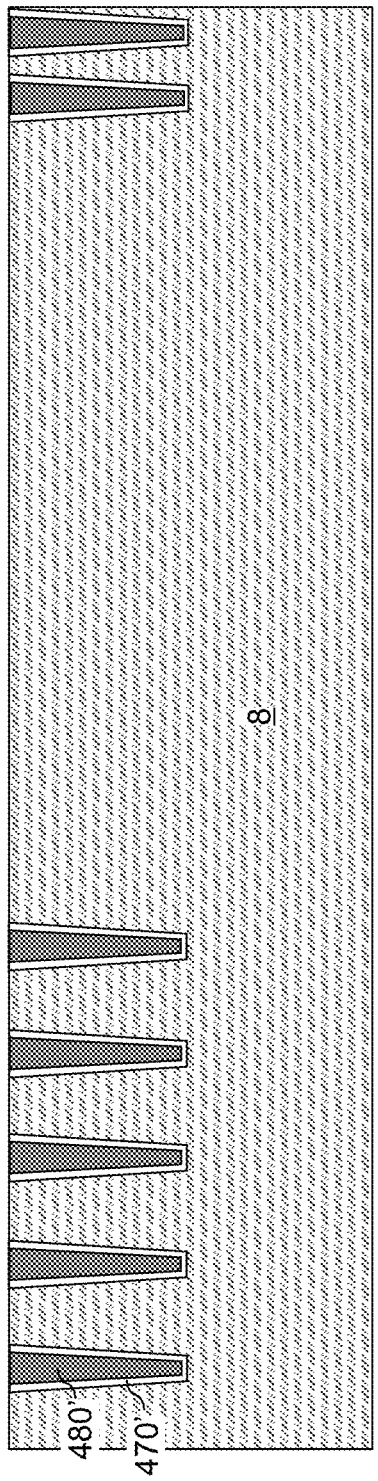
FIG. 21 is a schematic vertical cross-sectional view of an alternative exemplary structure after formation of conductive via structures in substrate via cavities according to the second embodiment of the present disclosure.

Referring to FIG. 21, an alternative exemplary structure according to an embodiment of the present disclosure is illustrated, which may be provided by forming substrate via cavities extending from the front side surface of a semiconductor substrate 8 toward the backside of the semiconductor substrate 8 prior to bonding the handle substrate to the memory-side dielectric material layers 640 located over the semiconductor substrate 8. The substrate via cavities may be formed before or after forming the three-dimensional memory device 102. The depth of the substrate via cavities may be in a range from 1 micron to 10 microns, although lesser and greater depths may also be employed. The lateral dimensions of the substrate via cavities at the front side surface of the semiconductor substrate 8 may be in a range from 300 nm to 6,000 nm, although lesser and greater lateral dimensions may also be employed. The substrate via cavities may be formed by applying a photoresist layer over the front side surface of the semiconductor substrate 8 and lithographically patterning the photoresist layer to form openings therethrough, and by transferring the pattern of the openings in the photoresist layer into the semiconductor substrate 8 employing an anisotropic etch process. Portions of the semiconductor substrate 8 that are not masked by the photoresist layer may be removed from the front side surface of the semiconductor substrate 8 toward the backside surface of the semiconductor substrate 8 during the anisotropic etch process. The photoresist layer may be subsequently removed, for example, by ashing.

The sidewalls of the substrate via cavities may be tapered such that each through-substrate via cavity has a greater lateral dimension within the plane of the front side surface of the semiconductor substrate 8 than at a bottom of the respective substrate via cavity. The taper angle of the sidewalls of the substrate via cavities may be in a range from 0.1 degree to 5 degrees, such as from 0.5 degrees to 2 degrees. Each of the substrate via cavities may have a lateral dimension (such as a diameter of a circular horizontal cross-sectional shape, a minor axis of an elliptical horizontal cross-sectional shape, or a width of a rectangular horizontal cross-sectional shape) within the plane of the front side surface of the semiconductor substrate 8 in a range from 300 nm to 6,000 nm, although lesser and greater lateral dimensions may also be employed.

A dielectric material layer may be deposited on the surfaces of the substrate via cavities by deposition of a dielectric material such as silicon oxide or a layer stack including a thin silicon nitride liner and a silicon oxide layer. At least one conductive material may be deposited in unfilled remaining volumes of the substrate via cavities on the dielectric material layer. The at least one conductive material may include a layer stack of a conductive metallic nitride liner (such as a TiN liner, a TaN liner, or a WN liner), and a conductive fill material layer that is deposited on the conducive metallic nitride liner. The conductive fill material layer may include a heavily doped semiconductor material (such as doped polysilicon) or a metallic fill material (such as tungsten, aluminum, copper, molybdenum, another elemental metal, or an alloy or a layer stack thereof). Portions of the dielectric material layer and portions of the at least one conductive fill material may be removed from above the horizontal plane including the front side surface of the semiconductor substrate 8 by a planarization process such as a recess etch or a chemical mechanical planarization process. Each remaining portion of the dielectric material layer constitutes a dielectric spacer 470', and each remaining portion of the at least one conductive fill material located inside a respective dielectric spacer 470' constitutes a conductive via structure 480'.

Figure 22:
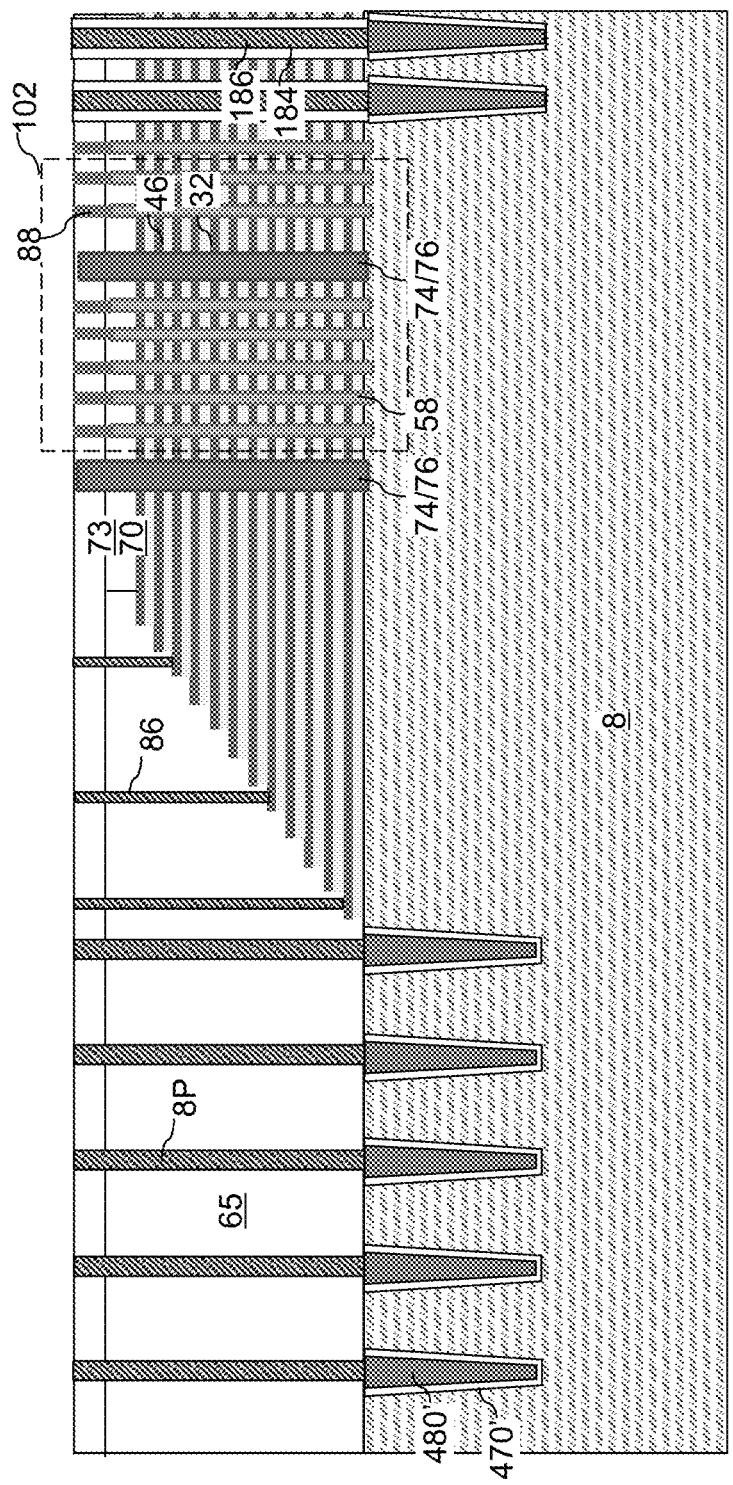
FIG. 22 is a schematic vertical cross-sectional view of the alternative exemplary structure after formation of a memory-level structure according to the second embodiment of the present disclosure.

Referring to FIG. 22, the processing steps of FIGS. 1-11B may be performed to form a memory-level structure containing the three-dimensional memory device 102. The through-memory-level via structures (186, 8P) may be formed directly on a top surface of a respective one of the conductive via structures 480'. The memory-side shallow trench isolation structures 120 may, or may not, be formed.

Figure 23:
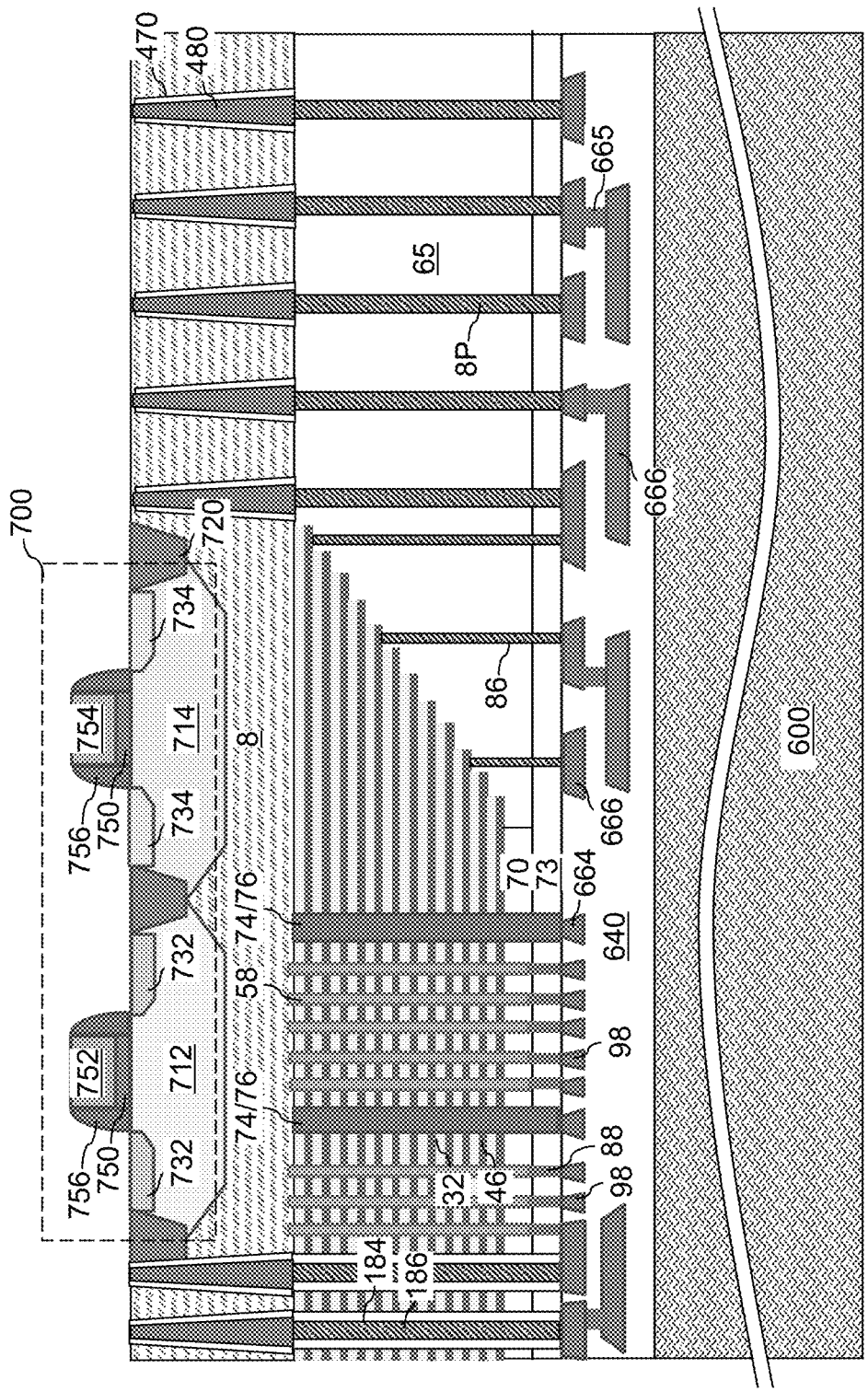
FIG. 23 is a schematic vertical cross-sectional view of the alternative exemplary structure after formation of field effect transistors on a backside of a thinned semiconductor substrate according to the second embodiment of the present disclosure.

Referring to FIG. 23, the processing steps of FIGS. 12-14 may be performed to form memory-side dielectric material layers 640 and memory-side metal interconnect structures (98, 664, 666, 665). A handle substrate 600 may be attached to the topmost (i.e., outermost) layer of the memory-side dielectric material layers 640. The semiconductor substrate 8 may be thinned to physically expose horizontal surfaces of the conductive via structures 480' that are proximal to the backside surface of the thinned semiconductor substrate 8. In this case, surfaces of the conductive via structures 480' and annular horizontal surfaces of the dielectric spacers 470' may be physically exposed upon thinning the semiconductor substrate 8. Each remaining portion of the dielectric spacers 470' may have a tubular configuration, and is herein referred to as a through-substrate dielectric spacer 470. Each remaining portion of the conductive via structure 480' constitutes a through-substrate via structure 480. Each contiguous combination of a through-substrate dielectric spacer 470 and a through-substrate via structure 480 constitutes a laterally-insulated through-substrate via structure (470, 480).

Subsequently, the processing steps of FIG. 16 may be performed to form at least one semiconductor device 700, such as CMOS devices including field effect transistors.

Figure 24:
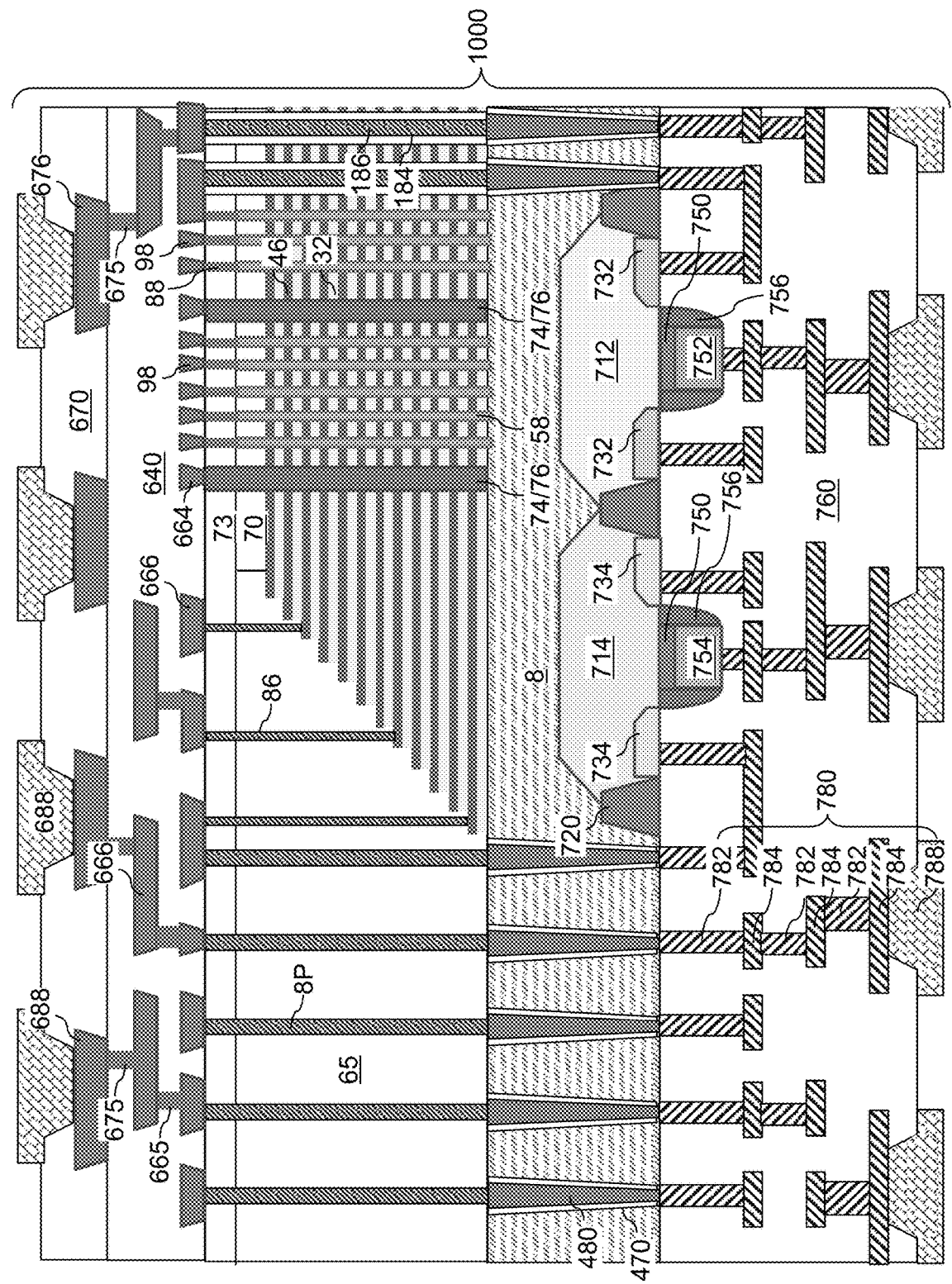
FIG. 24 is a schematic vertical cross-sectional view of the alternative exemplary structure after formation of logic-side bonding pads, removal of the handle substrate, and formation of memory-side bonding pads according to the second embodiment of the present disclosure.

Referring to FIG. 24, the processing steps of FIGS. 17-19 may be performed to provide a first semiconductor die 1000. The first semiconductor die 1000 of FIG. 24 may differ from the first semiconductor die 1000 of FIG. 19 by the direction of the taper angles of the sidewalls of the through-substrate dielectric spacers 470 and the through-substrate via structures 480.

The various embodiments of the present disclosure thin the semiconductor substrate 8 after providing a handle substrate 600 that is bonded to the memory-side dielectric material layers 640. The handle substrate 600 may be thick enough to provide sufficient mechanical support to the semiconductor substrate 8 and the memory-level structure during thinning of the semiconductor substrate 8 by grinding, polishing, an isotropic etch process, or an anisotropic etch process. The driver circuit devices may be formed on the backside of the thinned semiconductor substrate 8 at a relatively low temperature after forming the three-dimensional memory device 102, which improves the driver circuit performance and speed.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed of all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A method of forming a device structure, comprising:
forming a memory-level structure including a three-dimensional memory device over a front side surface of a semiconductor substrate;
forming memory-side dielectric material layers over the memory-level structure;
bonding a handle substrate to the memory-side dielectric material layers;
thinning the semiconductor substrate while the handle substrate is attached to the memory-side dielectric material layers;
forming a driver circuit including field effect transistors on a backside semiconductor surface of the semiconductor substrate after thinning the semiconductor substrate;
removing the handle substrate from the memory-side dielectric material layers
forming through-substrate via cavities in the semiconductor substrate;
forming laterally-insulated through-substrate via structures in the through-substrate via cavities;
forming through-memory-level via structures through the memory-level structure;
forming memory-side metal interconnect structures embedded in the memory-side dielectric material layers over the memory-level structure and over the through-memory-level via structures; and
forming logic-side metal interconnect structures embedded in logic-side dielectric material layers over the field effect transistors and over the backside semiconductor surface of the semiconductor substrate;
wherein:
the laterally-insulated through-substrate via structures contact a respective one of the through-memory-level via structures and vertically extend between the front side surface and the backside semiconductor surface of the semiconductor substrate;
the three-dimensional memory device comprises a combination of an alternating stack of insulating layers and electrically conductive layers and memory stack structures comprising a memory film and a vertical semiconductor channel vertically extending through the alternating stack;
the through-memory-level via structures vertically extend at least from a first horizontal plane including a surface of the alternating stack that is most distal from the semiconductor substrate and at least to a second horizontal plane including a surface of the alternating stack that is most proximal to the semiconductor substrate; and
the through-substrate via cavities are formed by anisotropically etching portions of the semiconductor substrate from the front side surface of the semiconductor substrate toward a backside surface of the semiconductor substrate prior to forming the memory-level structure.

2. The method of claim 1, further comprising:
forming dielectric spacers in the substrate via cavities; and
forming conductive via structures in remaining volumes of the through-substrate via cavities, wherein each contiguous combination of the dielectric spacers and the conductive via structures constitutes one of the laterally-insulated through-substrate via structures.

3. The method of claim 2, wherein:
the through-memory-level via structures are formed on the conductive via structures; and
surfaces of the conductive via structures and the dielectric spacers are physically exposed during or after the thinning of the semiconductor substrate.

* * * * *